US012690249B2

(12) United States Patent    (10) Patent No.:   US 12,690,249 B2

Kanno et al.    (45) Date of Patent:   Jul. 21, 2026

(54) ELECTRICALLY-CONDUCTIVE METAL OXIDE FILM INCLUDING A METAL OXIDE HAVING A FIRST METAL SELECTED FROM A METAL OF GROUP 4 OF THE PERIODIC TABLE AND A SECOND METAL SELECTED FROM A METAL OF GROUP 13 OF THE PERIODIC TABLE, AND SEMICONDUCTOR ELEMENT AND SEMICONDUCTOR DEVICE INCLUDING THE SAME

(71) Applicant: FLOSFIA INC., Kyoto (JP)

(72) Inventors: Ryohei Kanno, Kyoto (JP); Osamu Imafuji, Kyoto (JP); Kazuyoshi Norimatsu, Kyoto (JP); Yuji Kato, Kyoto (JP)

(73) Assignee: FLOSFIA INC., Kyoto (JP)

( * ) Notice: Subject to any disclaimer, the term of this patent is extended or adjusted under 35 U.S.C. 154(b) by 544 days.

(21) Appl. No.: 17/840,120

(22) Filed: Jun. 14, 2022

(65) Prior Publication Data

US 2022/0310798 A1    Sep. 29, 2022

Related U.S. Application Data

(63) Continuation-in-part of application No. PCT/JP2021/000581, filed on Jan. 8, 2021.

(30) Foreign Application Priority Data

Jan. 10, 2020   (JP) ................................. 2020-002602
Jan. 10, 2020   (JP) ................................. 2020-002603

(51) Int. Cl.
   *H10D 62/80*    (2025.01)
   *H10D 8/60*    (2025.01)

(52) U.S. Cl.
   CPC ............... *H10D 62/80* (2025.01); *H10D 8/60* (2025.01)

(58) Field of Classification Search
   None
   See application file for complete search history.

(56) References Cited

U.S. PATENT DOCUMENTS

2008/0142795 A1   6/2008   Ichinose et al.
2015/0325659 A1*   11/2015   Hitora ................. H01L 29/7393
                                   257/43

(Continued)

FOREIGN PATENT DOCUMENTS

CN    107201543    9/2017
JP    2005-260101    9/2005

(Continued)

OTHER PUBLICATIONS

International Search Report issued Apr. 13, 2021 in International (PCT) Application No. PCT/JP2021/000581.

(Continued)

*Primary Examiner* — Daniel Whalen
(74) *Attorney, Agent, or Firm* — Wenderoth, Lind & Ponack, L.L.P.

(57) ABSTRACT

An electrically-conductive metal oxide film that is useful for semiconductor element and a semiconductor element that has enhanced electrical properties are provided. An electrically-conductive metal oxide film comprising: a metal oxide as a major component, wherein the metal oxide includes at least a first metal selected from a metal of Group 4 of the periodic table and a second metal selected from a metal of Group 13 of the periodic table. The electrically-conductive metal oxide film is used to make a semiconductor element, and the obtained semiconductor element is used to make a semiconductor device such as a power card. Also, the (Continued)

semiconductor element and the semiconductor device are used to make a semiconductor system.

14 Claims, 13 Drawing Sheets

(56) References Cited

U.S. PATENT DOCUMENTS

| | | | |
|---|---|---|---|
| 2017/0168331 A1 | 6/2017 | Kim et al. | |
| 2017/0179249 A1* | 6/2017 | Oda | H01L 21/02565 |
| 2017/0200790 A1* | 7/2017 | Hitora | H01L 29/04 |
| 2020/0168711 A1 | 5/2020 | Sasaki | |
| 2020/0211919 A1* | 7/2020 | Takahashi | H01L 21/02628 |
| 2021/0151611 A1 | 5/2021 | Sasaki et al. | |
| 2021/0167225 A1 | 6/2021 | Arima et al. | |

FOREIGN PATENT DOCUMENTS

| | | |
|---|---|---|
| JP | 2009-81468 | 4/2009 |
| JP | 2013-12760 | 1/2013 |
| JP | 2015-115382 | 6/2015 |
| JP | 2018-60992 | 4/2018 |
| JP | 2019-16680 | 1/2019 |
| JP | 2019-36593 | 3/2019 |
| JP | 2019-67976 | 4/2019 |
| JP | 2019-79984 | 5/2019 |
| JP | 2019-142764 | 8/2019 |
| WO | 2016/013554 | 1/2016 |
| WO | 2017/110940 | 6/2017 |

OTHER PUBLICATIONS

Jun Liang Zhao et al., "UV and Visible Electroluminescence From a Sn:$Ga_2O_3$/$n^+$-Si Heterojunction by Metal-Organic Chemical Vapor Deposition", IEEE Transactions on Electron Devices, vol. 58, No. 5, May 2011, pp. 1447-1451.

Kohei Sasaki et al., "Si-Ion Implantation Doping in $\beta$-$Ga_2O_3$ and Its Application to Fabrication of Low-Resistance Ohmic Contacts", Applied Physics Express 6 (2013) 086502, Jul. 2013, pp. 086502-1-086502-4.

Extended European search report issued May 26, 2023 in European Patent Application No. 21738577.2.

Shizuo Fujita et al., "Epitaxial growth of corundum-structured wide band gap III-oxide semiconductor thin films", Journal of Crystal Growth, Elsevier, Amsterdam, NL, vol. 401, Mar. 5, 2014, pp. 588-592, XP029040762, ISSN: 0022-0248, DOI: 10.1016/J. JCRYSGRO.2014.02.032.

Masaya Oda et al., "Schottky barrier diodes of corundum-structured gallium oxide showing on-resistance of 0.1 m$\Omega$•$cm^2$ grown by Mist Epitaxy®", Applied Physics Express, vol. 9, 021101, Jan. 22, 2016, pp. 021101-1-021101-3, XP055727827, JP ISSN: 1882-0778, DOI: 10.7567/APEX.9.021101.

Ming-Hsun Lee et al., "Interfacial reactions of titanium/gold ohmic contacts with Sn-doped $\beta$-$Ga_2O_3$", APL Materials,. American Institute of Physics, vol. 7, No. 2, Feb. 1, 2019, pp. 022524-1-022524-8, XP012235092, DOI: 10.1063/1.5054624.

Office Action issued Feb. 15, 2025 in corresponding Chinese Patent Application No. 202180008631.6, with English translation.

* cited by examiner ( f )

( g )

Example 1

Example 2

STEM            Ti            Ga

STEM            Ti            Ga

ELECTRICALLY-CONDUCTIVE METAL OXIDE FILM INCLUDING A METAL OXIDE HAVING A FIRST METAL SELECTED FROM A METAL OF GROUP 4 OF THE PERIODIC TABLE AND A SECOND METAL SELECTED FROM A METAL OF GROUP 13 OF THE PERIODIC TABLE, AND SEMICONDUCTOR ELEMENT AND SEMICONDUCTOR DEVICE INCLUDING THE SAME

CROSS REFERENCE TO RELATED APPLICATION

This application is a continuation-in-part application of International Patent Application No. PCT/JP2021/000581 (Filed on Jan. 8, 2021), which claims the benefit of priority from Japanese Patent Applications No. 2020-002602 (filed on Jan. 10, 2020) and No. 2020-002603 (filed on Jan. 10, 2020).
The entire contents of the above applications, which the present application is based on, are incorporated herein by reference.

1. FIELD OF THE INVENTION

The disclosure is related to a electrically-conductive metal oxide film, semiconductor element, and a semiconductor device and/or a semiconductor system using the semiconductor element that are useful for power devices.

2. DESCRIPTION OF THE RELATED ART

Gallium oxide ($Ga_2O_3$) is a transparent semiconductor that has a band gap as wide as 4.8-5.3 eV at room temperature and absorbs almost no visible light and ultraviolet light. It is accordingly a promising material for use in optical and electronic devices and transparent electronics operated particularly in a deep ultraviolet region. In recent years, photodetectors, light emitting diodes (LED), and transistors based on gallium oxide ($Ga_2O_3$) have been developed.

Gallium oxide ($Ga_2O_3$) has five crystal structures of $\alpha$, $\beta$, $\gamma$, $\delta$, and $\epsilon$, and generally the most stable structure is $\beta$-$Ga_2O_3$. However, having a $\beta$-gallic structure, $\beta$-$Ga_2O_3$ is not always preferred to be used in semiconductor devices, different from crystal systems generally used in electronic materials and the like. Growth of a $\beta$-$Ga_2O_3$ thin film requires a high substrate temperature and a high degree of vacuum, causing a problem of an increase in manufacturing costs. In $\beta$-$Ga_2O_3$, even a high concentration (e.g., $1\times10^{19}/cm^3$ or more) dopant (Si) had to be annealed at high temperatures from 800° C. to 1100° C. after ion implantation to be used as a donor.

In contrast, having a crystal structure same as that of a sapphire substrate already sold for general purposes, $\alpha$-$Ga_2O_3$ is accordingly preferred to be used in optical and electronic devices. It further has a band gap wider than that of $\beta$-$Ga_2O_3$, and thus is particularly useful for a power device and semiconductors device using $\alpha$-$Ga_2O_3$ as the semiconductor are expected.

Semiconductor devices that use $\beta$-$Ga_2O_3$ as a semiconductor and use an electrode, to obtain ohmic characteristics compatible with it, with two layers of a Ti layer and an Au layer, three layers of a Ti layer, an Al layer, and an Au layer, or four layers of a Ti layer, an Al layer, a Ni layer, and an Au layer have been known.

A semiconductor device that uses $\beta$-$Ga_2O_3$ as a semiconductor and uses any one of Au, Pt, or a laminate of Ni and Au as an electrode to obtain Schottky characteristics compatible with the semiconductor has been known.

Unfortunately, application of the electrodes to a semiconductor device that uses $\alpha$-$Ga_2O_3$ as a semiconductor causes a problem, such as not functioning as a Schottky electrode or an ohmic electrode, failing to attach the electrode to the film, and impairing semiconductor properties.

In recent years, in case of using gallium oxide as a semiconductor, Ti/Au are used as an Ohmic electrode. While this Ohmic electrode has a good adhesion between Ohmic electrode and the semiconductor, it was not enough satisfactory in view of an Ohmic properties. Therefore, a semiconductor element using gallium oxide with enhanced Ohmic properties has been desired.

SUMMARY OF THE INVENTION

According to an example of the present disclosure, there is provided an electrically-conductive metal oxide film including: a metal oxide as a major component, wherein the metal oxide includes at least a first metal selected from a metal of Group 4 of the periodic table and a second metal selected from a metal of Group 13 of the periodic table.

Thus, an electrically conductive metal oxide film of the disclosure has enhanced electrical characteristics.

DETAILED DESCRIPTION

Figure 1:
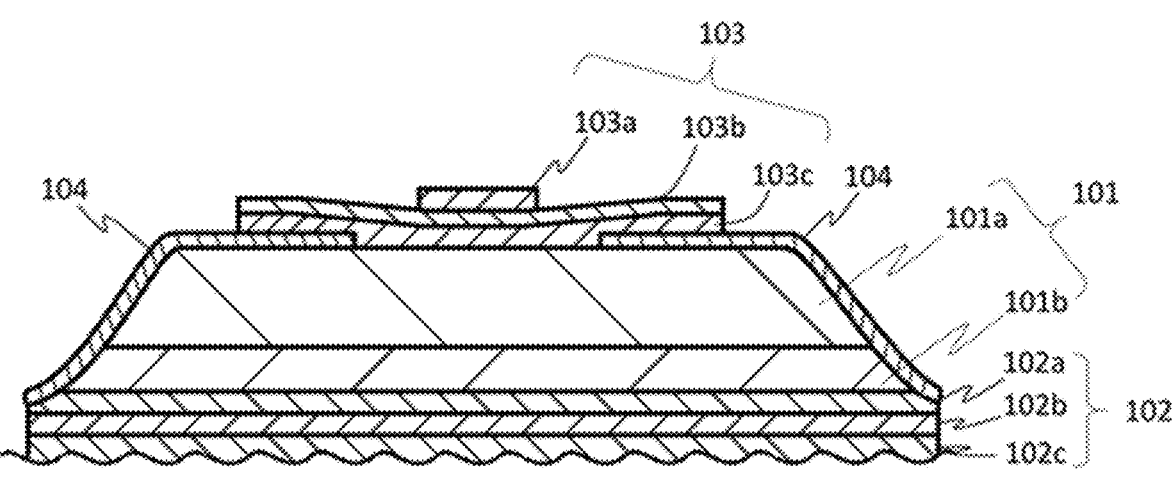
FIG. 1 is a cross-sectional schematic diagram illustrating a semiconductor element according to a preferred embodiment of the disclosure.

The inventors found the following matters. Ti/Au has been used as a known Ohmic electrode, however, there was a problem that Ti is diffused into a semiconductor layer that causes a deterioration of electrical properties. Also, when a Ti diffusion preventing film such as Ni is provided between a Ti layer and a Au layer, there was a problem that an oxygen of an oxide semiconductor diffuses in an Ohmic electrode that causes a deterioration of electrical properties. The inventors of the present disclosure found out that an electrically-conductive metal oxide film including: a metal oxide as a major component, wherein the metal oxide includes at least a first metal selected from a metal of Group 4 of the periodic table and a second metal selected from a metal of Group 13 of the periodic table has enhanced Ohmic characteristics. The inventors also found that the semiconductor element using the above-mentioned crystal has enhanced electrical properties. The inventors found that the electrically-conductive metal oxide film and the semiconductor element may solve the above-mentioned problem.

Embodiments of the present disclosure will be described below with reference to the accompanying drawings. In the following description, the same parts and components are designated by the same reference numerals. The present embodiment includes, for example, the following disclosures.

[Structure 1]

An electrically-conductive metal oxide film including: a metal oxide as a major component, wherein the metal oxide includes at least a first metal selected from a metal of Group 4 of the periodic table and a second metal selected from a metal of Group 13 of the periodic table.

[Structure 2]

The electrically-conductive metal oxide film according to [Structure 1] above, wherein the first metal includes at least a metal selected from titanium, zirconium and hafnium.

[Structure 3]

The electrically-conductive metal oxide film according to [Structure 1] or [Structure 2] above, wherein the first metal is titanium.

[Structure 4]

The electrically-conductive metal oxide film according to any one of [Structure 1] to [Structure 3] above, wherein the second metal includes at least a metal selected from aluminum, gallium and indium.

[Structure 5]

The electrically-conductive metal oxide film according to any one of [Structure 1] to [Structure 4] above, wherein the second metal is gallium.

[Structure 6]

The electrically-conductive metal oxide film according to any one of [Structure 1] to [Structure 5] above, wherein the metal oxide is a crystalline metal oxide.

[Structure 7]

The electrically-conductive metal oxide film according to [Structure 6] above, wherein the metal oxide has a corundum structure.

[Structure 8]

A semiconductor element, including: the electrically-conductive metal oxide film according to any one of [Structure 1] to [Structure 7] above.

[Structure 9]

A semiconductor element, including at least: a semiconductor layer; and an electrode that is arranged on the semiconductor layer, wherein the electrode includes the electrically-conductive metal oxide film according to any one of [Structure 1] to [Structure 7] above.

[Structure 10]

The semiconductor element according to [Structure 9] above, wherein the semiconductor layer includes a crystalline oxide semiconductor as a major component.

[Structure 11]

The semiconductor element according to [Structure 10] above, wherein the crystalline oxide semiconductor has a corundum structure.

[Structure 12]

The semiconductor element according to [Structure 10] or [Structure 11] above, wherein the crystalline oxide semiconductor contains at least a metal selected from aluminum, gallium and indium.

[Structure 13]

The semiconductor element according to any one of [Structure 8] to [Structure 12] above, wherein the semiconductor element is a vertical device.

[Structure 14]

The semiconductor element according to any one of [Structure 8] to [Structure 13] above, wherein the semiconductor element is a power device.

[Structure 15]

A semiconductor device, including: the semiconductor element according to any one of [Structure 8] to [Structure 14] above; a board; and a jointing material, and the semiconductor element that is bonded with the board by using the jointing material, the board is a circuit board or a heat dissipation board.

[Structure 16]

The semiconductor device according to [Structure 15] above, wherein the semiconductor device is a power module, an inverter, or a converter.

[Structure 17]

The semiconductor device according to [Structure 15] or [Structure 16] above, wherein the semiconductor device is a power card.

[Structure 18]

A semiconductor system, including: the semiconductor element according to any one of [Structure 8] to [Structure 14] above or the semiconductor device according to any one of [Structure 15] to [Structure 17] above.

An electrically-conductive metal oxide film according to an embodiment of the disclosure including: a metal oxide as a major component, wherein the metal oxide includes at least a first metal selected from a metal of Group 4 of the periodic table and a second metal selected from a metal of Group 13 of the periodic table. Examples of the metal of Group 4 of the Periodic Table include at least a metal selected from titanium, zirconium and hafnium. According to an embodiment of the disclosure, it is preferable that the metal of Group 4 of the Periodic Table is titanium. Examples of the metal Group 13 of the Periodic Table include at least a metal selected from aluminum, gallium and indium. According to an embodiment of the disclosure, it is preferable that the metal of Group 13 of the Periodic Table is gallium. According to an embodiment of the disclosure, it is preferable that the metal oxide is a crystalline metal oxide. Examples of a crystal structure of the crystalline metal oxide include a corundum structure, a β-gallia structure and a hexagonal structure (for example, ε-type structure). According to an embodiment of the disclosure, the crystalline metal oxide preferably has a corundum structure. According to an embodiment of the disclosure, a thickness of the electrically-conductive metal oxide film is not particularly limited. According to an embodiment of the disclosure, the thickness is preferably equal to or more than 5 nm, more preferably equal to or more than 10 nm. Such a preferred film thickness enables an improved electrical characteristics. The term "major component" herein means that the metal oxide is preferably contained in the electrically-conductive metal oxide film at an atomic ratio of equal to or more than 50% to all the components in the electrically-conductive metal oxide film. According to an embodiment of the disclosure, the metal oxide is more preferably contained in the electrically-conductive metal oxide film at an atomic ratio of equal to or more than 70% to all the components in the electrically-conductive metal oxide film, more preferably equal to or more than 90%. According to an embodiment of the disclosure, the metal oxide may be contained in the electrically-conductive metal oxide film at an atomic ratio in all the components of the crystal that is 100%.

The electrically-conductive metal oxide film may be obtained by, forming a film-shaped oxide of the first metal selected from Group 4 of the periodic table and the second metal selected from Group 13 of the periodic table. The film-shaped oxide may be obtained by causing a thermal reaction of the first metal and the second metal. A method of forming the electrically-conductive metal oxide film is not particularly limited, and may be a known method. Examples of the method of forming the electrically-conductive metal oxide film include a dry method and a wet method. Examples of the dry method include sputtering, vacuum deposition, and CVD. Examples of the wet method include screen printing and die coating. A condition of forming the electrically-conductive metal oxide film is not particularly limited. Usually, a condition is appropriately set, that is capable of causing a thermal reaction under an oxidizing atmosphere from metals.

Hereinafter, a preferred embodiment of the electrically-conductive metal oxide film in case of using the electrically-conductive metal oxide film as an Ohmic electrode of the semiconductor element. A preferred embodiment is explained by using a semiconductor element illustrated in FIG. 17. A multilayer structure that is a main portion of the semiconductor element of FIG. 17 includes a semiconductor layer 101 that is an oxide semiconductor film, a first metal oxide layer 102a, a second metal layer 102b, and a third metal layer 102c that are provided on the semiconductor layer 101. According to an embodiment of the disclosure, the electrically-conductive metal oxide film is used as the first metal oxide layer 102a.

The oxide semiconductor film (hereinafter, also referred to as "semiconductor layer" or "semiconductor film") is not particularly limited as long as the oxide semiconductor film is a semiconductor film containing an oxide. According to an embodiment of the disclosure, the oxide semiconductor film may be preferably a semiconductor film containing a metal oxide, more preferably a semiconductor film containing a crystalline oxide semiconductor, most preferably a semiconductor film containing a crystalline oxide semiconductor as a major component. According to an embodiment of the disclosure, the crystalline oxide semiconductor preferably contains one or more metals selected from a metal of group 9 (for example, cobalt, rhodium and iridium) and a metal of group 13 (for example, aluminum, gallium and indium). According to an embodiment of the disclosure, the crystalline oxide semiconductor more preferably contains at least a metal selected from aluminum, indium, gallium and iridium.

Also, according to an embodiment of the disclosure, the crystalline oxide semiconductor most preferably contains at least gallium and/or indium. A crystal structure of the crystalline oxide semiconductor is not particularly limited. Examples of the crystal structure of the crystalline oxide semiconductor include a corundum structure, a β-gallia structure and a hexagonal structure (for example, ε-type structure). According to an embodiment of the disclosure, the crystalline oxide semiconductor preferably has a corundum structure. Also, according to an embodiment of the disclosure, it is more preferable that the crystalline oxide semiconductor has a corundum structure and a m more preferably a main surface of the crystalline oxide semiconductor is a m-plane. Such a preferred configuration enables to suppress a diffusion of oxygen and to improve electrical characteristics. Also, the crystalline oxide semiconductor may have an off angle. According to an embodiment of the disclosure, the semiconductor film preferably includes gallium oxide and/or iridium oxide, and more preferably include $\alpha$-$Ga_2O_3$ and/or $\alpha$-$Ir_2O_3$. The term "major component" herein means that the crystalline oxide semiconductor is preferably contained in the semiconductor layer at an atomic ratio of equal to or more than 50% to all the components in the semiconductor layer. According to an embodiment of the disclosure, the crystalline oxide semiconductor is more preferably contained in the semiconductor layer at an atomic ratio of equal to or more than 70% to all the component in the semiconductor layer, further more preferably equal to or more than 90%. According to an embodiment of the disclosure, the crystalline oxide semiconductor may be contained in the semiconductor layer at an atomic ratio of 100% to all the components in the semiconductor layer. A thickness of the semiconductor layer is not particularly limited. The thickness of the semiconductor layer may be equal to or less than 1 μm. The thickness of the semiconductor layer may be equal to or more than 1 μm. According to an embodiment of the disclosure, the thickness of the semiconductor layer is preferably equal to or more than 1 μm, more preferably equal to or more than 10 μm. A surface area of the semiconductor film is not particularly limited. The surface area of the semiconductor film may be equal to or more than 1 mm$^2$ or more, and may be equal to or less than 1 mm$^2$. According to an embodiment of the disclosure, the surface area of the semiconductor film is preferably in a range of from $^2$10 mm$^2$ to 300 cm, and more preferably in a range of from $^2$ of 100 mm$^2$ to 100 cm. The semiconductor film is preferably a single crystal film. The semiconductor film may be a polycrystalline film or a crystalline film containing a polycrystalline. Further, the semiconductor film may be a multilayer film including at least a first semiconductor layer and a second semiconductor layer. A Schottky electrode may be provided on the first semiconductor layer. In this case, in the semiconductor layer may be a multilayer film, in which, a first carrier concentration of the first semiconductor layer is smaller than a second carrier concentration of the second semiconductor layer. Also, in this case, the second semiconductor layer usually contains a dopant. The carrier concentration of the semiconductor layer may be appropriately set by adjusting a doping amount.

According to an embodiment of the disclosure, the semiconductor layer contains a dopant. The dopant is not particularly limited and may be a known dopant. Examples of the dopant include an n-type dopant such as tin, germanium, silicon, titanium, zirconium, vanadium and niobium, and a p-type dopant such as magnesium, calcium, and zinc. According to an embodiment of the disclosure, the semiconductor layer preferably contains the n-type dopant. According to an embodiment of the disclosure, it is more preferable that the semiconductor layer is the n-type oxide semiconductor layer. Further, according to an embodiment of the disclosure, the n-type dopant is preferably Sn, Ge or Si. A concentration of the dopant in the semiconductor layer is preferably equal to or more than 0.00001 atomic % in a composition of the semiconductor layer, more preferably in a range of from 0.00001 atomic % to 20 atomic %, and most preferably in a range of from 0.00001 atomic % to 10 atomic %. More specifically, the concentration of the dopant in the semiconductor layer may be usually in a range of from $1\times10^{16}$ per $cm^3$ to $1\times10^{22}/cm^3$. Further, according to an embodiment of the disclosure, the concentration the dopant in the semiconductor layer may be a low concentration of, for example, approximately equal to or less than $1\times10^{17}/cm^3$. Further, according to an embodiment of the disclosure, the dopant may be contained in the semiconductor layer at a high concentration of, approximately equal to or more than $1\times10^{20}/cm^3$. A concentration of a fixed charge of the semiconductor layer is also not particularly limited. According to an embodiment of the disclosure, the concentration of the fixed charge of the semiconductor layer is preferably equal to or less than $1\times10$ $cm^{3/17}$. Such a preferred configuration enables to form a depletion layer in the semiconductor layer more favorably.

The semiconductor layer may be formed by using a known method. Examples of the method of forming the semiconductor layer include CVD method, MOCVD method, MOVPE method, mist-CVD method, mist-epitaxy method, MBE method, HVPE method, pulse-growth method and ALD method. According to an embodiment of the disclosure, the method of forming the semiconductor layer is preferably a mist CVD method or a mist epitaxy method. In the mist CVD method or mist epitaxy method, the semiconductor layer is formed as follows, for example. Atomizing a raw material solution to float the droplets (atomization step); carrying the obtained atomized droplets with a carrier gas to the substrate after atomization (carrying step); by causing a thermal reaction of the atomized droplets in a vicinity of the substrate to form a semiconductor layer containing a crystalline oxide semiconductor as a major component on the substrate (film forming step).

(Atomization Step)

In the atomization step, the raw material solution is atomized. The method of atomizing the raw material solution is not particularly limited as long as the raw material solution can be atomized, and may be a known method, but in the present disclosure, an atomization method using ultrasonic waves is preferred. The atomized droplets obtained using ultrasonic waves are preferably zero in initial velocity and float in the air, for example, rather than spraying like spray, because it is an atomized droplet (including mist) capable of floating in space and transported as a gas, it is very suitable because there is no damage due to collision energy. The droplet size is not particularly limited and may be a droplet of about several millimeters, but is preferably 50 μm or less, and more preferably 100 nm to 10 μm.

(Raw Material Solution)

The raw material solution is not particularly limited as long as it can be atomized and contains a raw material capable of forming a semiconductor film, and may be an inorganic material or an organic material. In the present disclosure, the raw material is preferably a metal or a metal compound, and more preferably contains 1 or 2 or more kinds of metals selected from aluminum, gallium, indium, iron, chromium, vanadium, titanium, rhodium, nickel, cobalt and iridium.

According to an embodiment of the disclosure, the raw material solution containing the metal, in a form of complex or salt, dissolved or dispersed in an organic solvent or water may be used. Examples of the form of the complex include an acetylacetonate complex, a carbonyl complex, an ammine complex, a hydride complex. Also, examples of the form of the salt include an organic metal salt (e.g., metal acetate, metal oxalate, metal citrate, etc.), metal sulfide, metal nitrate, phosphorylated metal, metal halide (e.g., metal chloride, metal bromide, metal iodide, etc.).

Further, the raw material solution may contain a hydrohalic acid and/or an oxidant as an additive. Examples of the hydrohalic acid include hydrobromic acid, hydrochloric acid and hydroiodic acid. Examples of the oxidant include hydrogen peroxide (H2O2), sodium peroxide (Na2O2), barium peroxide (BaO2), a peroxide including benzoyl peroxide (C6H5CO)2O2, hypochlorous acid (HClO), perchloric acid, nitric acid, ozone water, and an organic peroxide such as peracetic acid and nitrobenzene.

The raw material solution may contain a dopant. The dopant is not particularly limited unless it deviates from an object of the disclosure. Examples of the dopant include an n-type dopant or tin, germanium, silicon, titanium, zirconium, vanadium and niobium. The dopant concentration in general may be in a range of from approximately in a range of from $1\times10^{16}/cm^3$ to $1\times10^{22}/cm^3$. The dopant concentration may be at a lower concentration of, for example, approximately equal to or less than $1\times10^{11}/cm^3$. According to an embodiment of the disclosure, the dopant may be contained at a high concentration of, for example, approximately equal to or more than $1\times10^{20}/cm^3$.

A solvent of the raw material solution is not particularly limited unless it deviates from an object of the present disclosure, and the solvent may be an inorganic solvent such as water. The solvent may be an organic solvent such as alcohol. Also, the solvent may be a mixed solvent of the inorganic solvent and the organic solvent. According to an embodiment of the disclosure, the solvent preferably includes water.

At a carrying step, the atomized droplets are delivered to the substrate by using a carrier gas. The carrier gas is not particularly limited unless it deviates from an object of the present disclosure. Examples of the carrier gas include oxygen, ozone, an inert gas such as nitrogen and argon and a reducing gas such as hydrogen gas and a forming gas. The carrier gas may include one type of carrier gas. Further, the carrier gas may contain one or two or more gasses. Also, a diluted gas (e.g., 10-fold diluted carrier gas) and the like may be further used as a second carrier gas. The carrier gas may be supplied from one or more locations. The flow rate of the carrier gas is not particularly limited. A flow rate the carrier gas may be preferably a flow rate that enables the carrying step to be a supply rate limiting state. More specifically, the flow rate of the carrier gas is preferably equal to or not more than 1 LPM, and more preferably in a range of from 0.1 LPM to 1 LPM.

At a film forming step, a film is formed on the uneven portion by a reaction of the atomized droplets. The reaction is not particularly limited as long as the film is formed from the atomized droplets in the reaction. According to an embodiment of the disclosure, the reaction is preferably a thermal reaction. The thermal reaction may be a reaction in which the atomized droplets react with heat. Reaction conditions and the like are not particularly limited unless it deviates from an object of the present disclosure. In the film forming step, the thermal reaction is in generally carried out at an evaporation temperature of the solvent of the raw material solution or at a higher temperature than the evaporation temperature. The temperature during the thermal reaction should not be too high, and preferably equal to or less than 650° C. The temperature during the thermal reaction is preferably in a range of from 300° C. to 650° C. Further, the thermal reaction may be conducted in any atmosphere unless it deviates from an object of the disclosure. The thermal reaction may be conducted in a vacuum atmosphere, a non-oxygen atmosphere, a reducing gas atmosphere and an oxygen atmosphere. In addition, the thermal reaction may be conducted under any condition including under an atmospheric pressure, under an increased pressure, and under a reduced pressure. According to an embodiment of the disclosure, the thermal reaction may be preferably conducted under an atmospheric pressure. By conducting the thermal reaction under an atmospheric pressure, a calculation of an evaporation temperature would be easier and an equipment and the like would be more simplified. Further, a film thickness of the crystalline oxide semiconductor may be set by adjusting a deposition time The base is not particularly limited as long as the base can support the semiconductor film. A material of the base is not particularly limited unless it deviates from an object of the disclosure, and may be a known base. The base may be an organic compound or an inorganic compound. The base may be in any shape, and can perform for any shape. Examples of the shape of the base include plate such as flat plate or a disc, fibrous, bar, columnar, prismatic, cylindrical, spiral, spherical and annular. According to one or more embodiments of the disclosure, the base is preferably a substrate. A thickness of the substrate is not particularly limited according to one or more embodiments of the disclosure.

The substrate is not particularly limited as long as the substrate is in the shape of plate and can support the semiconductor film. The substrate may be an insulator substrate, a semiconductor substrate, a metal substrate or a conductive substrate, however, the substrate is preferably an insulator substrate and also preferably a substrate having a metal film on a surface thereof. Examples of the substrate include a substrate including a substrate material with a corundum structure as a major component, a substrate including a substrate material with a β-Gallia structure as a major component or a substrate including a substrate material with a hexagonal structure as a major component. The term "major component" herein means that the substrate preferably contains a substrate material with a particular crystalline structure at an atomic ratio of 50% or more to all components of a substrate material contained in the substrate. The substrate preferably contains the substrate material with the particular crystalline structure at an atomic ratio of 70% or more to all components of the substrate material contained in the substrate and more preferably contains at an atomic ratio of 90% or more. The substrate may contain the substrate material with the particular crystalline structure at an atomic ratio of 100% to all components of the substrate material contained in the substrate.

Furthermore, a material for the substrate is not particularly limited if an object of the present inventive subject matter is not interfered with, and also, the material may be a known one. Examples of a substrate with a corundum structure include α-Al$_2$O$_3$ (sapphire substrate) and α-Ga$_2$O$_3$. Also, according to an embodiment of the present inventive subject matter, the substrate may be an a-plane sapphire substrate, an m-plane sapphire substrate, an r-plane sapphire substrate, a c-plane sapphire substrate, an a gallium oxide substrate (a-plane, m-plane, or r-plane), and the like. Furthermore, examples of the substrate contain a substrate material with a β-gallia structure as a major component include a β-Ga$_2$O$_3$ substrate, a mixed crystal substrate containing Ga$_2$O$_3$ and Al$_2$O$_3$, where Al$_2$O$_3$ is more than 0 wt % and 60 wt % or less, and the like. Examples of the substrate containing the substrate material with a hexagonal structure as a major component include an SiC substrate, a ZnO substrate, a GaN substrate, and the like.

According to an embodiment of the present inventive subject matter, after the film formation process, annealing may be performed. The annealing temperature may not be particularly limited if an object of the present inventive subject matter is not interfered with. The annealing temperature may be generally from 300° C. to 650° C. According to an embodiment of the present inventive subject matter, the annealing temperature may be preferably from 350° C. to 550° C. Also, the annealing time is generally from 1 minute to 48 hours. According to an embodiment of the present inventive subject matter, the annealing time may be preferably from 10 minutes to 24 hours, and further preferably from 30 minutes to 12 hours. The annealing may be performed in any atmosphere if an object of the present inventive subject matter is not interfered with. The annealing may be performed in a non-oxygen atmosphere. Also, the annealing may be performed in a nitrogen atmosphere.

According to an embodiment of the disclosure, the semiconductor layer may be provided directly on a base or may be provided on another layer, such as a buffer layer and a stress relief layer, positioned above or below the base.

According to an embodiment of the disclosure, a semiconductor layer may include a base, which may be used in a semiconductor device.

The Ohmic electrode includes at least a first metal oxide layer that forms an Ohmic contact with the semiconductor layer, a second metal layer, and a third metal layer. The second metal layer and the third metal layer are composed of one or more metals that are different from each other. The second metal layer is arranged between the first metal oxide layer and the third metal layer. According to an embodiment of the disclosure, it is preferable that the first metal oxide layer of the Ohmic electrode is the electrically-conductive metal oxide film. A material of the second metal layer and/or the third metal layer of the Ohmic electrode is not particularly limited, and may be a known material, respectively. Examples of the second metal layer and/or the third metal layer include at least one metal selected from Groups 4 to 11 of the Periodic Table. Examples of a metal of Group 4 of the Periodic Table include titanium (Ti), zirconium (Zr) and hafnium (Hf). Examples of a metal of Group 5 of the Periodic Table include vanadium (V), niobium (Nb) and tantalum (Ta). Examples of metals of Group 6 of the Periodic Table include chromium (Cr), molybdenum (Mo) and tungsten (W). Examples of a metal of Group 7 of the Periodic Table include manganese (Mn), technetium (Tc), and rhenium (Re). Examples of a metal of Group 8 of the Periodic Table include iron (Fe), ruthenium (Ru), and osmium (Os). Examples of a metal of Group 9 of the Periodic Table include cobalt (Co), rhodium (Rh), and iridium (Ir). Examples of a metal of Group 10 of the Periodic Table include nickel (Ni), palladium (Pd), and platinum (Pt). Examples of a metal of Group 11 of the periodic table include copper (Cu), silver (Ag), and gold (Au). According to an embodiment of the disclosure, the second metal layer is preferably a metal of Group 4 of the Periodic Table, and more preferably titanium. Further, the third metal layer is preferably a metal of Group 10 of the Periodic Table, and more preferably nickel. Such a preferred metal enables to further improve the electrical characteristics of the electrically-conductive metal oxide film. A thickness of the second metal layer and/or the third metal layer of the ohmic electrode is not particularly limited. The thickness of each of the second metal layer and/or the third metal layer of the ohmic electrode is preferably in a range of from 0.1 nm to 10 μm, and more preferably in a range of from 1 nm to 1000 nm.

A method of forming the Ohmic electrode is not particularly limited, and may be a known method. Examples of the method of forming the Ohmic electrode include a dry method and a wet method. Examples of the drying method include sputtering, vacuum deposition, and CVD. Examples of the wet method include screen printing and die coating. According to an embodiment of the disclosure, the method of forming the electrically-conductive metal oxide film is preferably mist CVD method or mist epitaxy method.

The semiconductor element may include a Schottky electrode. According to a preferred embodiment of the disclosure, the semiconductor element is preferably a Schottky barrier diode. The Schottky electrode (hereinafter, also referred to as "electrode layer") is not particularly limited if the Schottky electrode has a electrical conductivity and may be used as a Schottky electrode. A material of the electrode layer may be an electrically conductive inorganic material or may be an electrically conductive organic material. According to an embodiment of the disclosure, the material of the electrode layer is preferably a metal. Examples of a preferred metal include at least one metal selected from Groups 4 to 10 of the Periodic Table. According to an embodiment of the disclosure, the electrode layer preferably contains at least one metal selected from groups 4, group 6 and group 9 of the periodic table. According to an embodiment of the disclosure, the electrode layer more preferably contains at least one metal selected from Group 6 and 9 of the periodic table, and most preferably contains Mo and/or Co. A thickness of the electrode layer is not particularly limited. According to an embodiment of the disclosure, the thickness of the electrode layer is preferably in a range of from 0.1 nm to 10 μm, more preferably in a range of from 5 nm to 500 nm, and most preferably in a range of from 10 nm to 200 nm. In addition, According to an embodiment of the disclosure, it is preferable that the electrode layer is made of two or more layers that have different compositions from each other. Such a preferred configuration of the electrode layer enables to obtain a semiconductor element having enhanced Schottky characteristics and enables to exhibit a better effect of a suppression of leakage current.

In case that the first electrode layer includes two or more layers including the first electrode layer and the second electrode layer, it is preferable that the second electrode layer has electrical conductivity and has a higher electrical conductivity than the first electrode layer. A material of the second electrode layer may be an electrically conductive inorganic material or an electrically conductive organic material. According to an embodiment of the disclosure, the material of the second electrode is preferably a metal. Preferable examples of the metal include at least a metal selected from Groups 8 to 13 of the Periodic Table. Examples of the metal of groups 8 to 10 of the periodic table include the metals of groups 8 to 10 of the periodic table as explained in the description of the metal of the electrode layer. Examples of the metal of Group 11 of the periodic table include copper (Cu), silver (Ag), and gold (Au). Examples of metal of group 12 of the periodic table include zinc (Zn), and cadmium (Cd). Examples of the metal of group 13 of the Periodic Table include aluminum (Al), gallium (Ga), and indium (In). According to an embodiment of the disclosure, the second electrode layer preferably contains at least one metal selected from Group 11 and Group 13 of the Periodic Table, and more preferably contains at least one metal selected from silver, copper, gold and aluminum. A thickness of the second electrode layer is not particularly limited. The thickness of the second electrode layer is preferably in a range of from 1 nm to 500 μm, more preferably in a range of from 10 nm to 100 μm, and most preferably in a range of from 0.5 μm to 10 μm. According to an embodiment of the disclosure, it is preferable that a thickness of the insulator film under an outer end of the electrode layer is thicker than a thickness of the insulator film positioned from the opening to a distance of 1 μm from the opening. Such a preferred configuration enables to have more enhanced breakdown voltage characteristics of the semiconductor element.

According to a preferred embodiment of the disclosure, the Schottky electrode includes a first metal layer, a second metal layer and a third metal layer. Also, according the preferred embodiment of the disclosure, the first metal layer, the second metal layer and the third metal layer includes metals that are different from each other. The second metal layer is arranged between the first metal layer and the third metal layer. The first metal layer is placed so as to be nearer to the semiconductor layer side than the third metal layer. In case that the Schottky electrode includes a first metal layer, a second metal layer and a third metal layer, it is preferable that the first metal layer includes a metal of group 6 of the periodic table or a metal of group 9 of the periodic table. Also in this case, it is preferable that the second electrode layer includes a metal of group 4 of the periodic table and the third metal layer includes a metal of group 13 of the periodic table. Here, it is more preferable that the first metal layer is a Co layer or a Mo layer, the second metal layer is a Ti layer, and the third metal layer is an Al layer, respectively.

A method of forming the electrode layer is not particularly limited, and may be a known method. Examples of the method of forming the Ohmic electrode include a dry method and a wet method. Examples of the drying method include sputtering, vacuum deposition, and CVD. Examples of the wet method include screen printing and die coating. According to an embodiment of the disclosure, the method of forming the crystal is preferably mist CVD method or mist epitaxy method.

Further, according to an embodiment of the disclosure, the Schottky electrode preferably has a structure in which a thickness is reducing toward a outer portion of the semiconductor element. In this case, the Schottky electrode may have a tapered region on the side surface. Further, the Schottky electrode may include two or more layers including a first electrode layer and a second electrode layer, and the outer end of the first electrode layer may be located outer than the outer end of the second electrode layer. According to an embodiment of the disclosure, if the Schottky electrode has a tapered region, the taper angle the tapered region is not particularly limited unless it deviates from an object of the disclosure. The taper angle is preferably equal to or less than 80°, more preferably equal to or less than 60°, and most preferably equal to or less than 40°. A lower limit of the taper angle is not particularly limited. The lower limit of the taper angle is preferably 0.2°, more preferably, 1°. Further, according to an embodiment of the disclosure, in case that the outer end of the first electrode layer of the Schottky electrode is positioned outer side than the outer end of the second electrode layer, it is preferable that the distance between the outer end of the first electrode layer and the outer end of the second electrode layer is equal to or more than 1 μm. Such a preferred configuration enables a smaller leakage current. According to an embodiment of the disclosure, it is preferable that at least a part of a portion of the first electrode layer that is positioned outer side than the outer end of the second electrode (hereinafter, also referred to as "overhanging portion") has a structure in which a thickness is reducing toward a outer portion of the semiconductor element. With such a preferred configuration, it is possible to further improve a withstand voltage of the semiconductor element. Also, by using such preferred electrode and above-mentioned preferred material of the semiconductor layer in combination, it is possible to obtain the semiconductor element with a lower leakage current and a lower loss.

The semiconductor element preferably includes an oxide semiconductor layer, and a dielectric film covering at least a side surface of the oxide semiconductor layer. With this configuration, it is possible to suppress deterioration of semiconductor properties of the oxide semiconductor film due to a moisture absorption or oxygen in the air. According to an embodiment of the disclosure, the tapered region of the side surface of the semiconductor layer enables not only to improve an adhesion between the semiconductor layer and the dielectric film but also to improve a stress relaxation that leads a enhanced reliability.

The dielectric film is formed on the semiconductor layer and usually has an opening. A relative dielectric constant of the dielectric film is not particularly limited. The dielectric film may be a known dielectric film. According to an embodiment of the disclosure, it is preferable that the dielectric film is formed at least 1 μm or more from the opening. Also, according to an embodiment of the disclosure, it is preferable that the relative dielectric constant of the dielectric film is equal to or less than 5. The term "relative dielectric constant" herein means a ratio of the dielectric constant of a film to a dielectric constant of vacuum. According to an embodiment of the disclosure, it is preferable that the dielectric film is a film containing Si. Preferred examples of the film containing Si include a silicon oxide-based film. Examples of the silicon oxide-based film includes a $SiO_2$ film, a phosphorus-doped SiO BPSG film, a boron-doped $SiO_2$ film, a phosphorus-doped SiOC film, a SiOF film, and the like. A method of forming the dielectric film is not particularly limited. Examples of the method of forming the dielectric film includes CVD method, atmospheric pressure CVD method, plasma CVD method, mist CVD method, and thermal oxidation method. According to an embodiment of the disclosure, the method of forming the dielectric film is preferably a mist CVD method or atmospheric pressure CVD method.

Also, the semiconductor element according to an embodiment of the disclosure further includes a porous layer that is arranged on the third metal layer of the Ohmic electrode. The porous layer is not particularly limited. The porous layer preferably has electrical conductivity, and more preferably contains a noble metal. According to an embodiment of the disclosure, a porosity of the porous layer is preferably equal to or less than 10%. Such a preferred porosity enables to alleviate a warpage or a concentration of thermal stress without impairing semiconductor properties. A method of forming the porous layer with a porosity that is equal to or less than 10% is not particularly limited, and may be a known method. According to an embodiment of the disclosure, the porous layer with a porosity that is equal to or less than 10% may be formed by appropriately setting a sintering conditions such as sintering time, sintering pressure, and a sintering temperature. Examples of the method of forming the porous layer includes a method in which the porosity is adjusted to be equal to or less than 10% by a crimping under heating (thermocompression bonding). Also, examples of the method of forming a porous layer include a method in which sintering is performed at a longer time than usual. By using such a porous layer having a porosity of equal to or less than 10% in the semiconductor element, it is possible to alleviate a warpage or a concentration of thermal stress without impairing semiconductor properties. The term "porosity" herein means a ratio of a volume of voids to a volume of the porous layer (including the volume of the voids). The porosity of the porous layer may be determined, for example, based on cross-sectional photographs taken by using scanning electron microscopy (SEM: Scanning Electron Microscope). More specifically, the porosity of the porous layer may be determined by following steps. A cross-sectional photograph of the porous layer (SEM image) is taken at a plurality of positions. Next, using a commercially available image analysis software, performing binarization of a captured SEM image to obtain a ratio of a portion corresponding to the void (for example, a black portion) in the SEM image. The ratio of the black portion obtained from the SEM image taken at a plurality of positions is averaged to determine the porosity of the porous layer. The term "porous layer" herein includes not only a porous film that has a continuous film-shape, but also a porous film with aggregate shape.

Also, according to an embodiment of the disclosure, it is preferable that a substrate is arranged on the porous layer. The substrate may be directly arranged on the porous layer. The substrate may be arranged on the porous layer via other layers including one or more metal layers (for example, the above-mentioned metal layers).

A direction of current flow of the semiconductor element according to an embodiment of the disclosure is not particularly limited. According to an embodiment of the disclosure, it is preferable that the Schottky electrode is arranged on a first surface side of the oxide semiconductor film and the Ohmic electrode is arranged on a second surface side of the oxide semiconductor film that is opposite to the first surface side. According to an embodiment of the disclosure, it is more preferable that the semiconductor element is a vertical device.

EXAMPLE

Hereinafter, preferred embodiments of the disclosure will be described in more detail with reference to drawings. The disclosure is not limited to the following embodiments.

Figure 18:
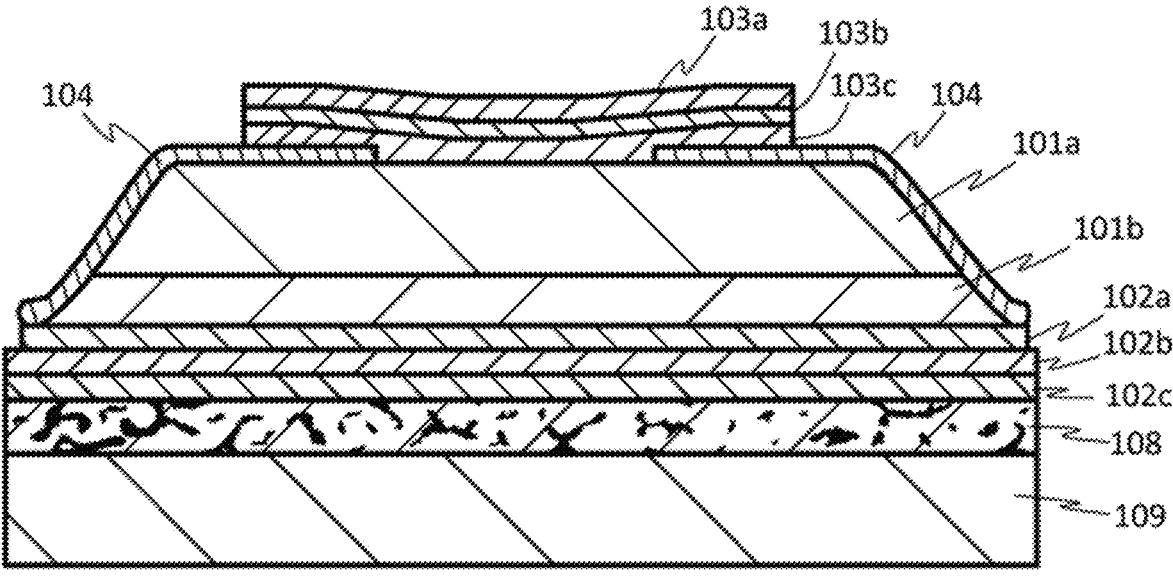
FIG. 18 is a cross-sectional view schematically showing an embodiment of a semiconductor device of the present disclosure.

FIG. 1 illustrates a main portion of a Schottky barrier diode (SBD) that is a semiconductor element according to a preferable embodiment of the disclosure. The SBD of FIG. 1 includes an Ohmic electrode 102, a semiconductor layer 101, a Schottky electrode 103, and a dielectric film 104. The ohmic electrode 102 includes a metal oxide layer (electrically-conductive metal oxide film) 102a, a metal layer 102b, and a metal layer 102c. The semiconductor layer 101 includes a first semiconductor layer 101a and a second semiconductor layer 101b. The Schottky electrode 103 includes a metal layer 103a, a metal layer 103b, and a metal layer 103c. The first semiconductor layer 101a is, for example, an n--type semiconductor layer. The second semiconductor layer 101b is, for example, an n+-type semiconductor layer 101b. The dielectric film 104 (hereinafter, also referred to as "insulator film") covers a side surface of the semiconductor layer 101 (a side surface of the first semiconductor layer 101a and a side surface of the second semiconductor layer 101b). Also, the dielectric film 104 has an opening that is located on an upper surface of the semiconductor layer 101 (first semiconductor layer 101a). The opening is provided between a part of the first semiconductor layer 101a and the metal layer 103c of the Schottky electrode 103. The dielectric film 104 may be extended so as to cover a part of the upper surface of the semiconductor layer 101 (the first semiconductor layer 101a) in addition to cover a side surface of the semiconductor layer 101. The dielectric film 104 of the semiconductor element of FIG. 1 enables to improve a crystal defects at the end of the semiconductor layer, to form a depletion layer more favorably. Also, the dielectric film 104 of the semiconductor element of FIG. 1 enables to improve a relaxation of electric s field that leads a more suppression of current leakage. A preferred embodiment of the SBD is illustrated in FIG. 18, in which the porous layer 108 and the substrate 109 are provided.

Figure 6:
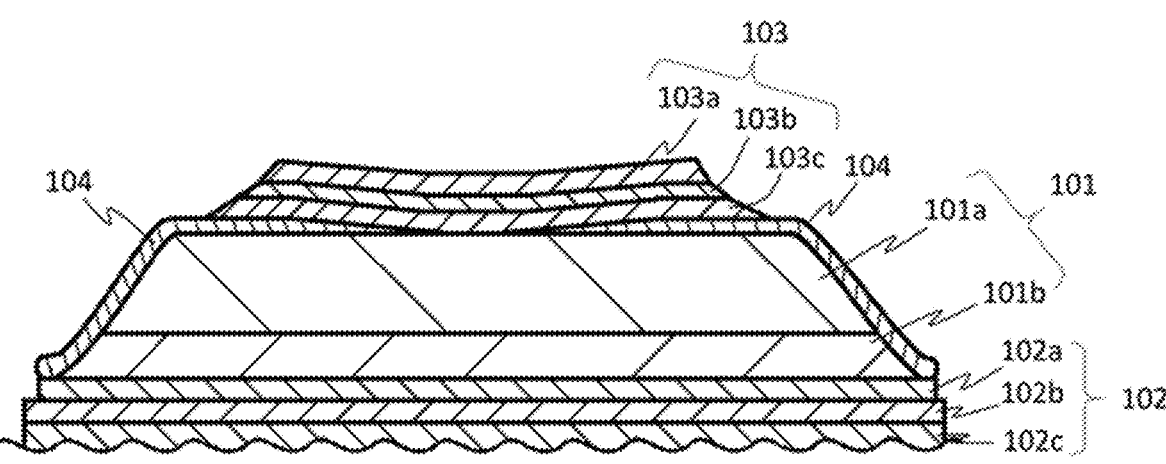
FIG. 6 is a cross-sectional schematic diagram illustrating a semiconductor element according to a preferred embodiment of the disclosure.

FIG. 6 illustrates a main portion of a Schottky barrier diode (SBD) that is the semiconductor element according to a preferred embodiment of the disclosure. The SBD of FIG. 6 differs from the SBD of FIG. 1 in a point that a tapered region is provided on a side surface of the Schottky electrode 103. In the semiconductor element of FIG. 6, the outer end of the metal layer 103b and/or the metal layer 103c is located outer side than an outer end of the metal layer 103a as the second metal layer. Therefore, it is possible to suppress leakage current more favorably. Also, a part of the metal layer 103b and/or the metal layer 103c that is placed outer than the outer end of the metal layer 103a has a tapered region in which a film thickness is reducing toward the outside of the semiconductor element. Therefore, the semiconductor element has a more enhanced withstand voltage.

Example of a material of the metal layer 103a includes the above-mentioned metals. In addition, examples of the materials of the metal layer 103b and the metal layer 103c include the above-described metals. A method of forming each layer of FIG. 1 is not particularly limited unless it deviates from an object of the disclosure, and may be a known method. A method of forming each layer included in the semiconductor device of FIG. 18 is not particularly limited unless it deviates from an object of the disclosure, and may be a known method. Examples of the method of forming the each layer include a method in which, after a film is formed using a vacuum evaporation method, a CVD method, a sputtering method or other various coating techniques, patterning is conducted by photolithography. Also, examples of the method of forming the each layer include a method in which patterning is conducted directly by using a printing technique and the like.

Figure 2:
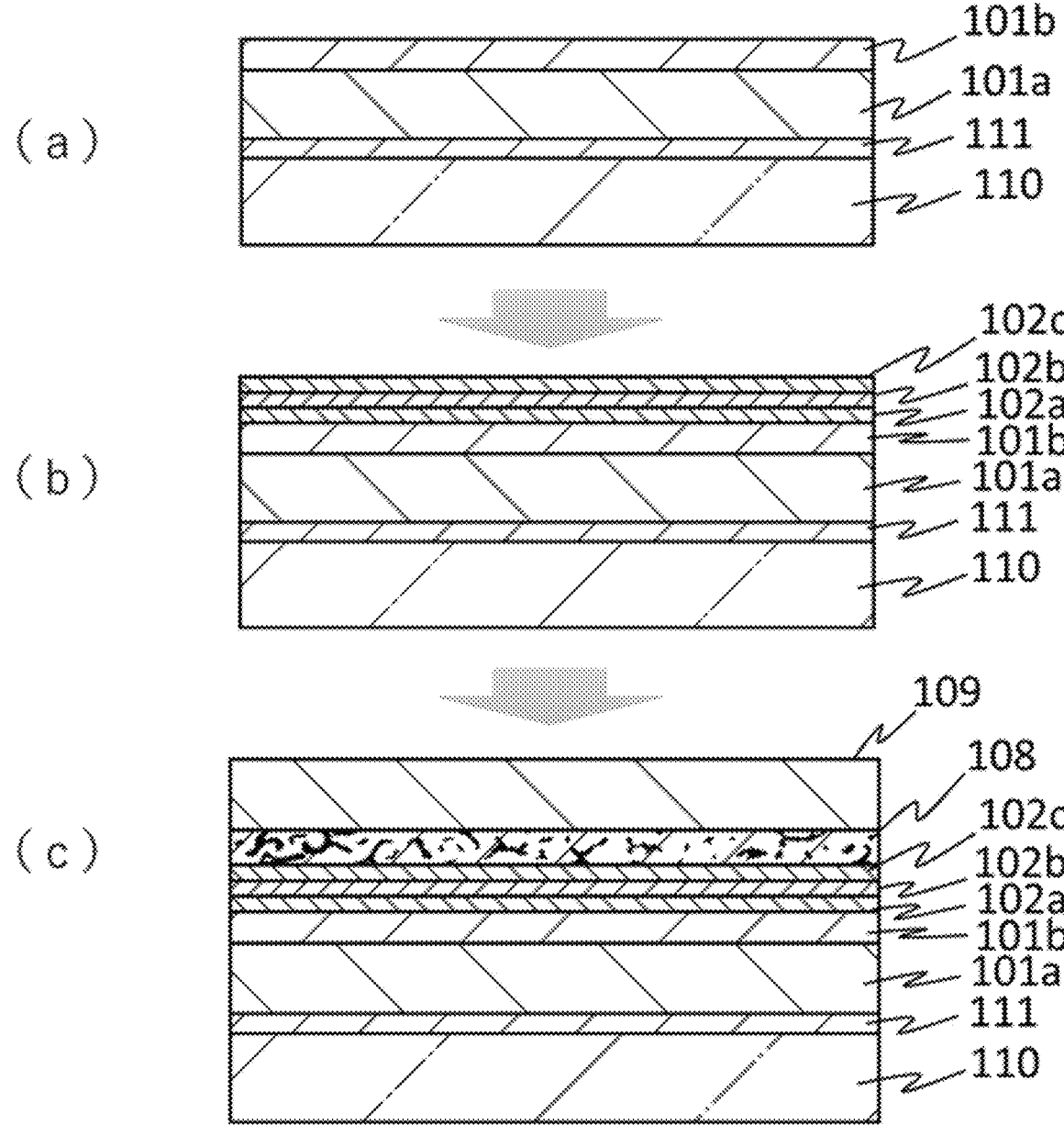
FIG. 2 is a diagram illustrating a preferred embodiment of a method of the semiconductor element of FIG. 1.
Figure 3:
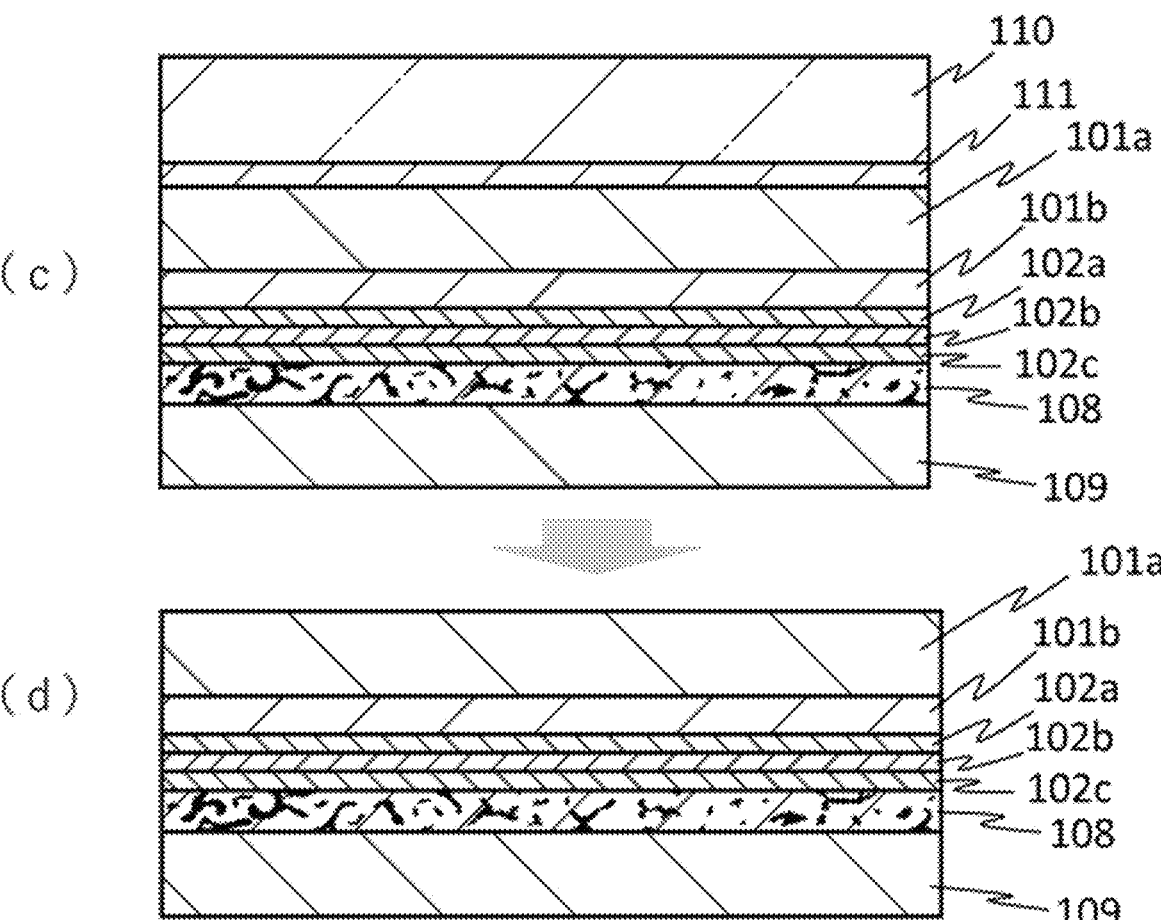
FIG. 3 is a diagram illustrating a preferred embodiment of a method of the semiconductor element of FIG. 1.
Figure 4:
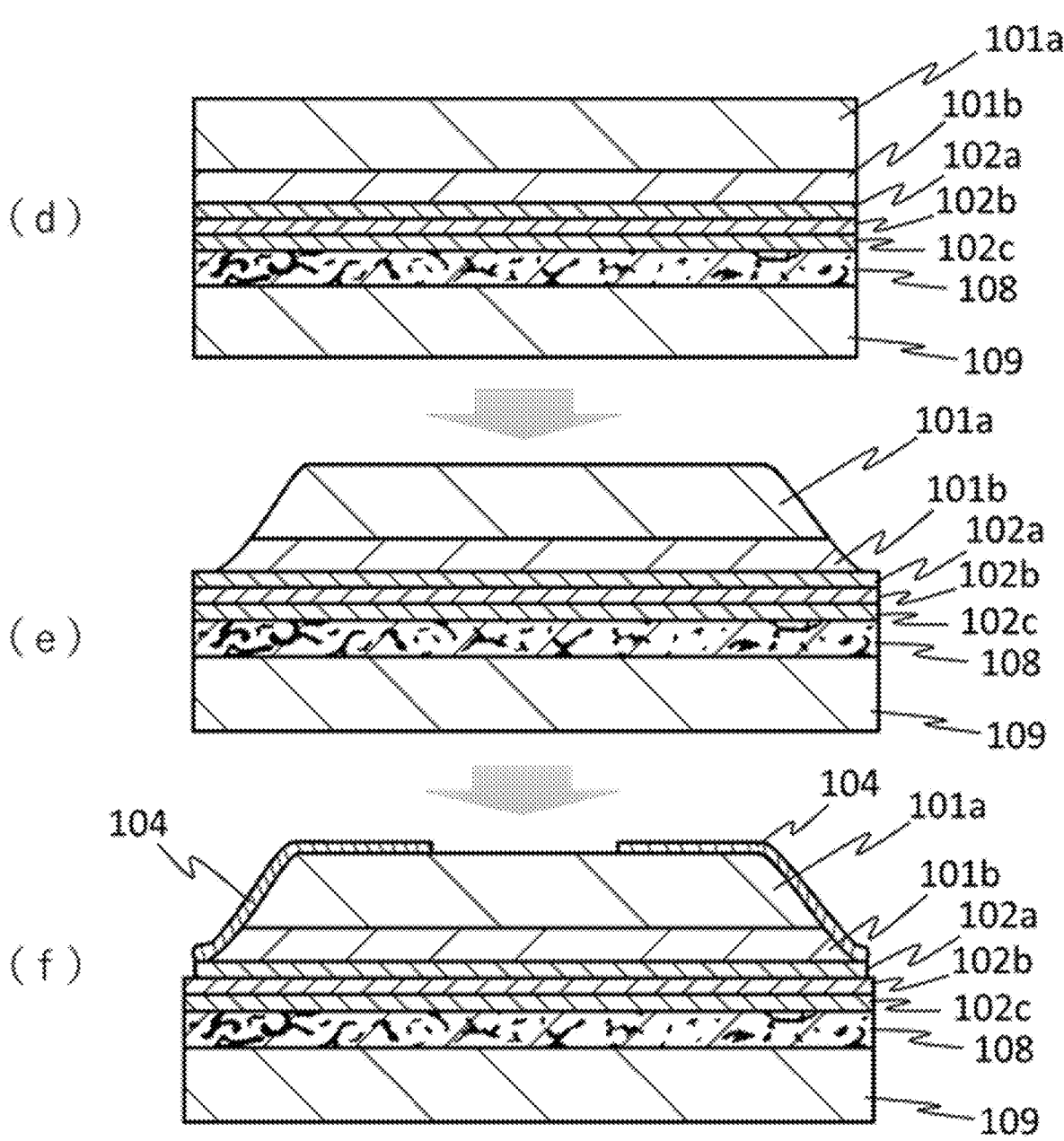
FIG. 4 is a diagram illustrating a preferred embodiment of a method of the semiconductor element of FIG. 1.
Figure 5:
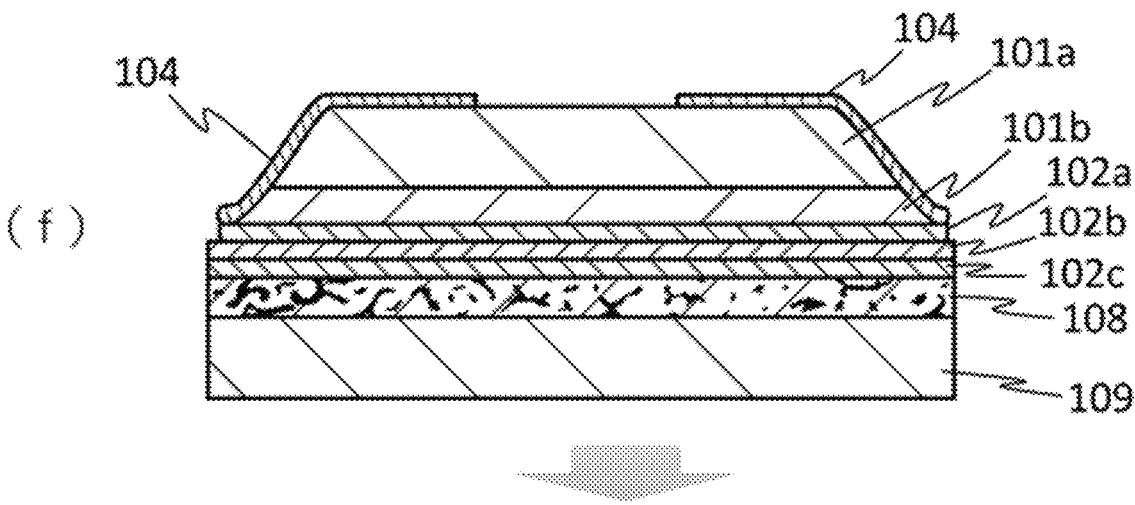
FIG. 5 is a diagram illustrating a preferred embodiment of a method of the semiconductor element of FIG. 1.
Figure 5:
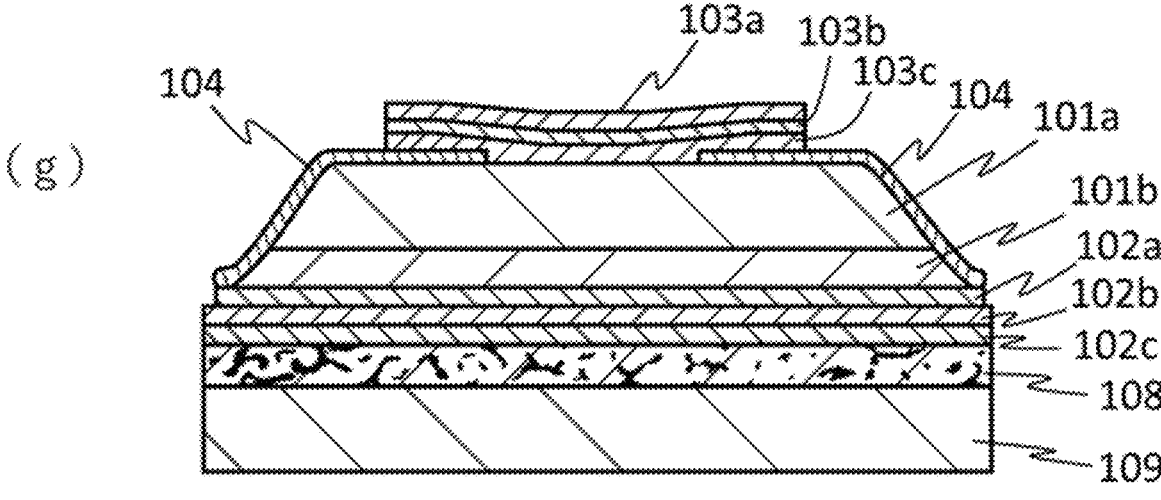

Hereinafter, a preferred manufacturing process of the SBD of FIG. 18 will be described. The disclosure is not limited to these preferred manufacturing methods. FIG. 2 (a) illustrates a multilayer body in which a first semiconductor layer 101a and a second semiconductor layer 101b are provided on a crystal-growth substrate (a sapphire substrate) 110 via a stress relaxation layer. The first semiconductor layer 101a and the second semiconductor layer 101b are formed by above-mentioned mist CVD method. A multilayer structure of FIG. 2 (b) is obtained by forming a metal oxide layer (electrically-conductive metal oxide film) 102a, a metal layer 102b, and a metal layer 102c as an Ohmic electrode. The metal oxide layer (electrically-conductive metal oxide film) 102a, a metal layer 102b, and a metal layer 102c are formed by the above-mentioned dry method or the above-mentioned wet method. The first semiconductor layer 101a is, for example, an n--type semiconductor layer. The second semiconductor layer 101b is, for example, an n+-type semiconductor layer. Further, a multilayer (c) is obtained by laminating a substrate 109 on the multilayer structure of FIG. 2(b) via a porous layer 108 that is made of a noble metal. Then, as illustrated in FIG. 3, the crystal-growth substrate 110 and the stress relaxation layer 111 of the multilayer (c) are peeled off using a known peeling method, to obtain a multilayer structure (d). Then, as illustrated in FIG. 4, a multilayer structure (d) is obtained by etching the side surface of the semiconductor layer of the multilayer structure (d) to make tapered-shape. Next, obtaining a multilayer structure (f) by forming an insulating film 104 on the upper surface of the semiconductor layer, other than an opening of of the semiconductor layer and the tapered side surface. Next, as illustrated in FIG. 5, a multilayer structure (g) is obtained by forming a metal layers 103a, 103b and 103c as a Schottky electrode on the opening of the semiconductor layer. The metal layers 103a, 103b and 103c are formed by using the above-mentioned dry method or the above-mentioned wet method. The semiconductor element obtained as described above has enhanced Ohmic characteristics. Also, a crystal defect of the end portion is improved in the obtained semiconductor element. Therefore, a depletion layer is formed more favorably and the effect of a relaxation of electric field can be obtained in the obtained semiconductor element. In addition, the obtained semiconductor element has a configuration that enables to suppress more current leakage.

Figure 7:
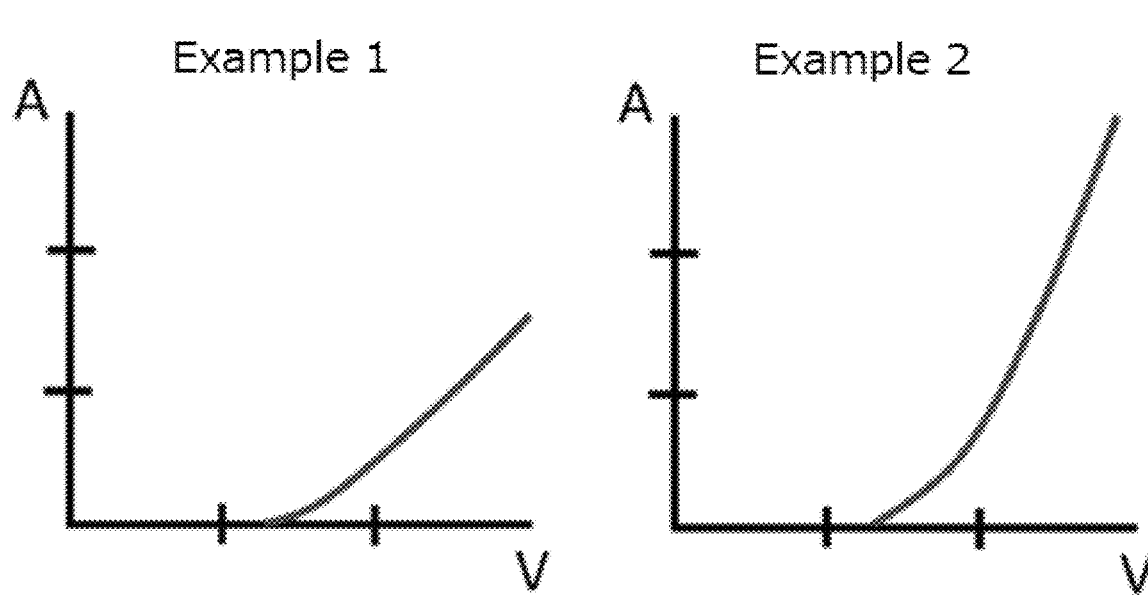
FIG. 7 is a diagram illustrating the results of I-V measurement in an example.
Figure 8:
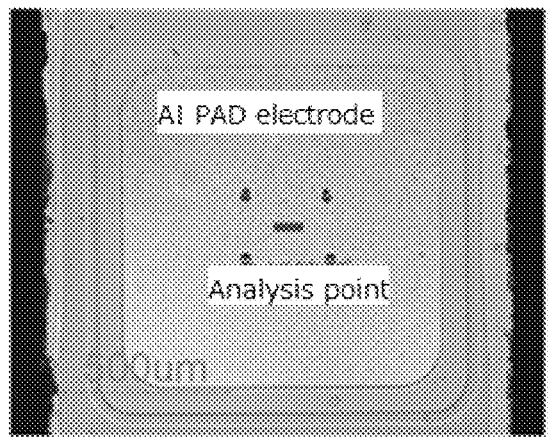
FIG. 8 is a diagram illustrating an exterior photograph of a semiconductor element (chip) in an example, and an analysis point of the cross-sectional TEM of FIG. 9.
Figure 8:
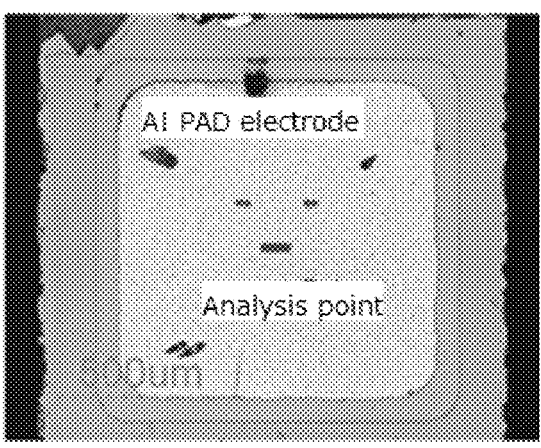
Figure 9:
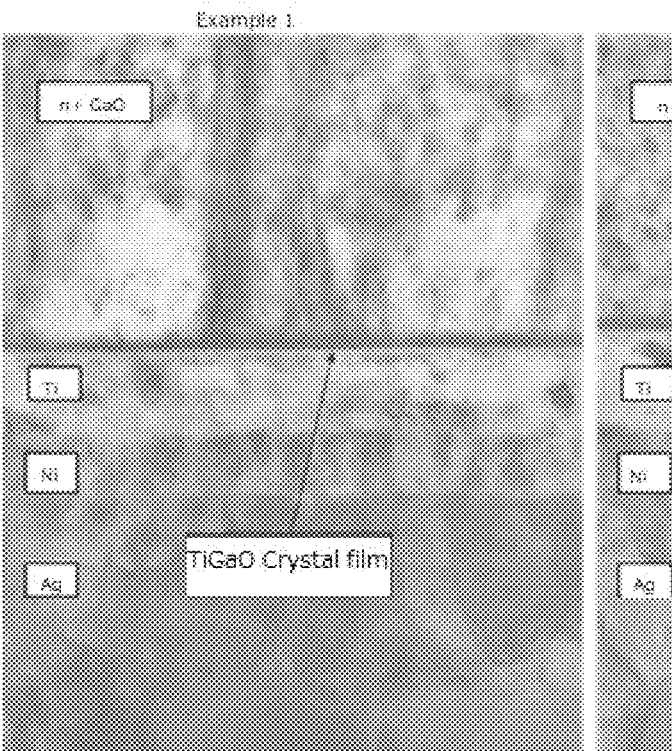
FIG. 9 is a diagram illustrating a cross-sectional TEM image in an example.
Figure 9:
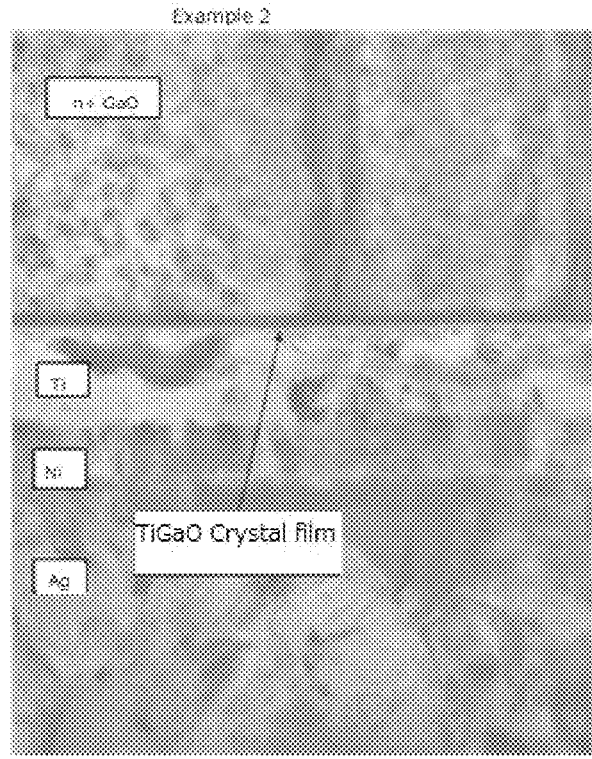
Figure 10:
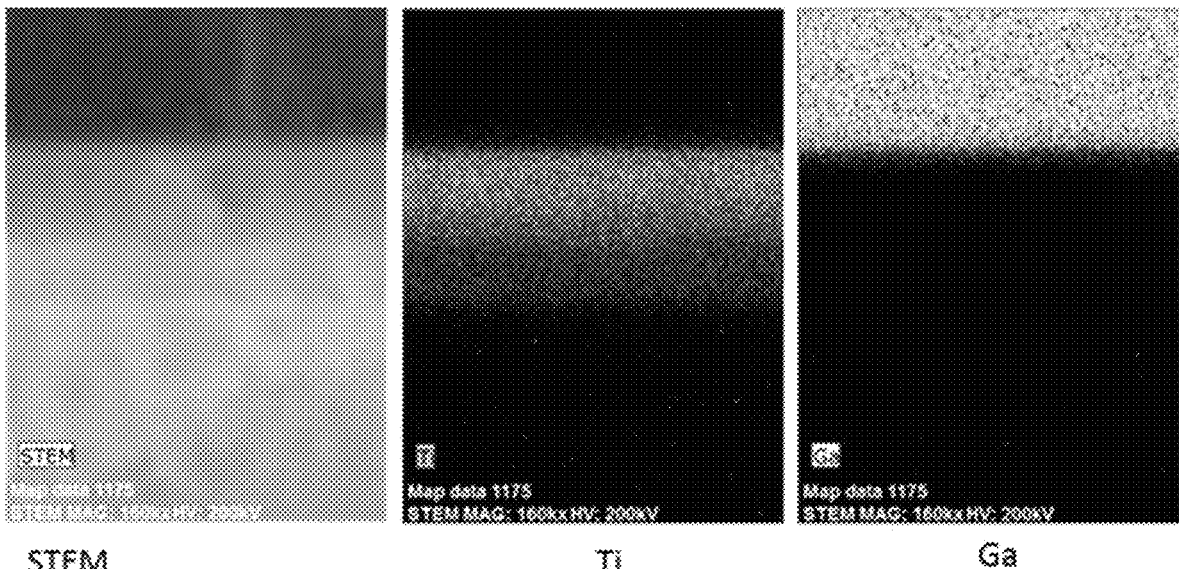
FIG. 10 is a diagram illustrating a result of TEM-EDS analysis of $\alpha$-$(Ti_XGa_{1-X})_2O_3$ film, $0<X<1$) in FIG. 9.

As an example of the disclosure, a semiconductor element of illustrated in FIG. 18 was produced based on the above-mentioned procedure. Materials used in the example 1 is as follows. $\alpha$-$(Ti_XGa_{1-X})_2O_3$ film (in the formula, $0<X<1$) was used as the metal oxide layer (electrically-conductive metal oxide film) 102a. Ti was used as the metal layer 102b. Ni was used as the metal layer 102c. Further, in the example 1, an un-doped $\alpha$-$Ga_2O_3$ was used as the stress relaxation layer 111. Tin-doped $\alpha$-$Ga_2O_3$ was used as the first semiconductor layer 101a. Tin-doped $\alpha$-$Ga_2O_3$ was used as the second semiconductor layer 101b. Al was used as the metal layer 103a. Ti was used as the metal layer 103b. Co was used as the metal layer 103c. $SiO_2$ was used as the insulating film 104. A porous layer made of Ag was used as the porous layer 108. A electrically conductive substrate containing Cu and Mo was used as the substrate 109. An exterior photograph of the obtained semiconductor element of the example 1 is illustrated in FIG. 8. Also, the observation result of the cross-sectional TEM at the analysis point of shown in FIG. 8 is illustrated in FIG. 9. The result of TEM-EDS analysis is illustrated in FIG. 10. As is apparent from FIGS. 9 and 10, it can be seen that the film of $\alpha$-$(Ti_XGa_{1-X})_2O_3$ (in the formula, $0.5<X<1$) is well formed. Also, I-V measurement of the semiconductor element of the example 1 was conducted. The results are illustrated in FIG. 7. As illustrated in FIG. 7, it can be seen that the semiconductor element of the example 1 has good semiconductor properties.

Figure 11:
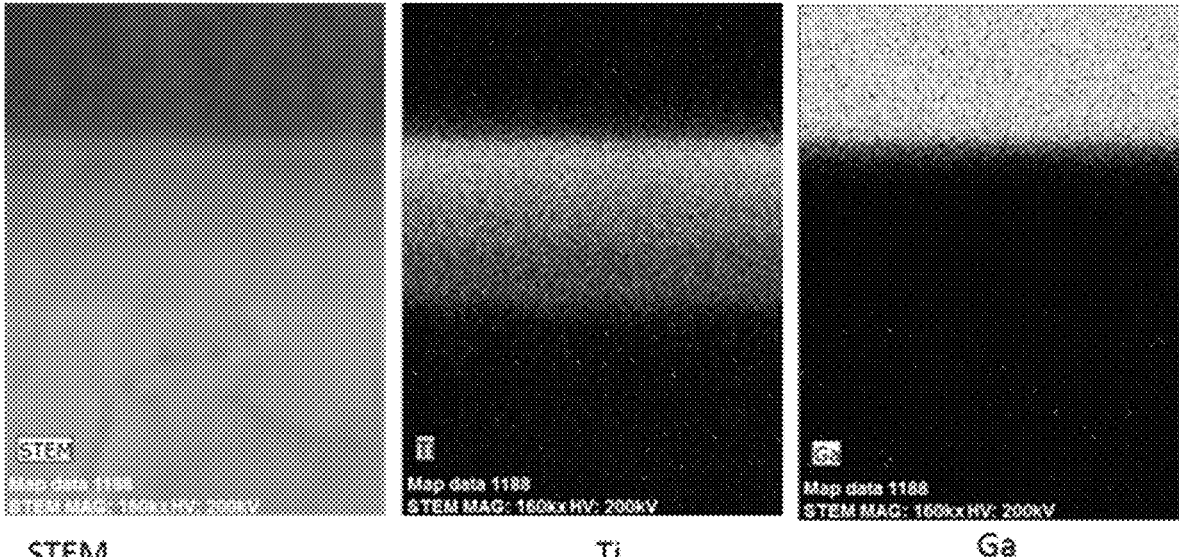
FIG. 11 is a diagram illustrating a result of TEM-EDS analysis of $\alpha$-$(Ti_XGa_{1-X})_2O_3$ film, $0<X<1$) in FIG. 9.
Figure 12:
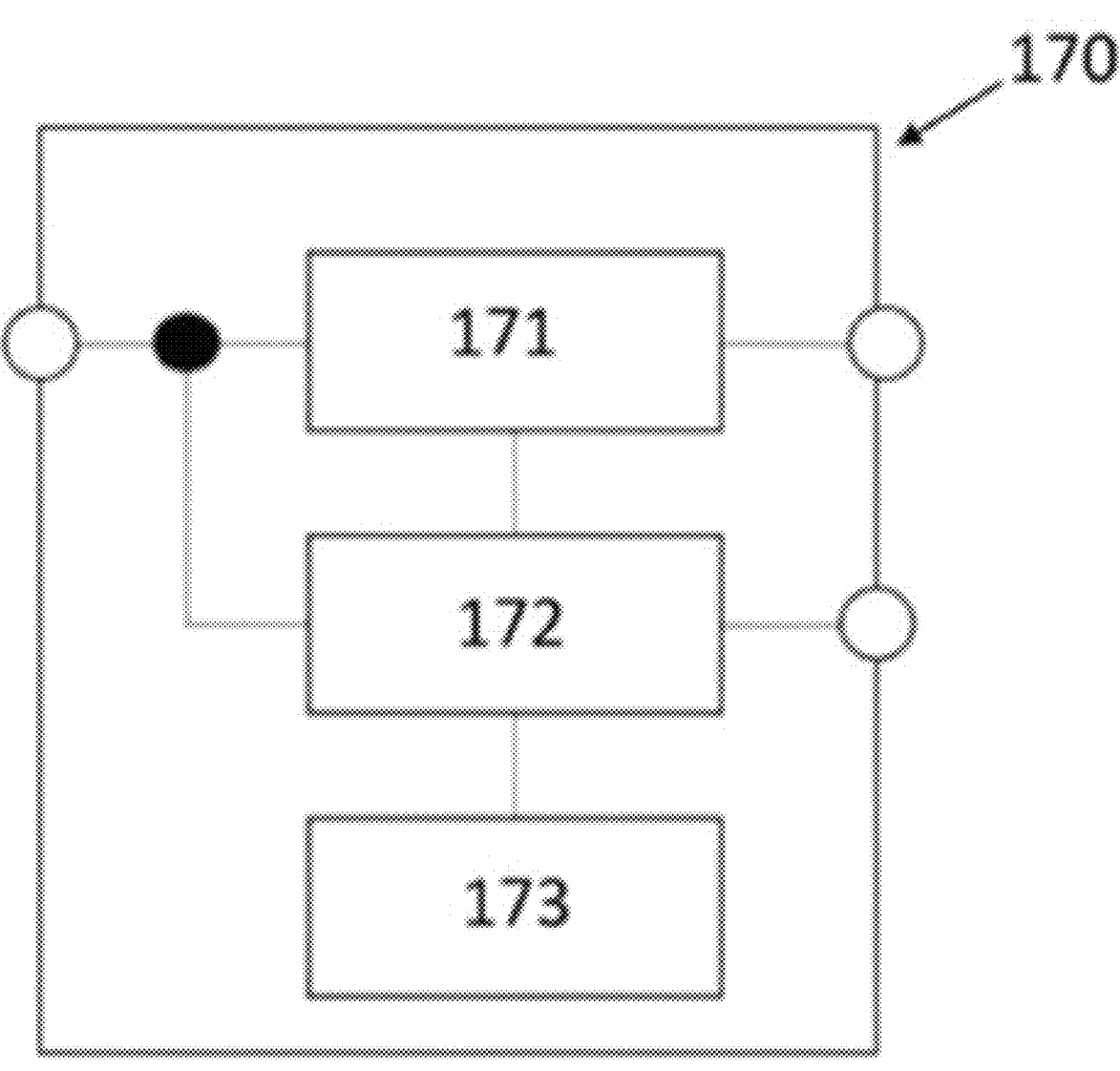
FIG. 12 is a schematic diagram illustrating a preferred embodiment of a power supply system.
Figure 13:
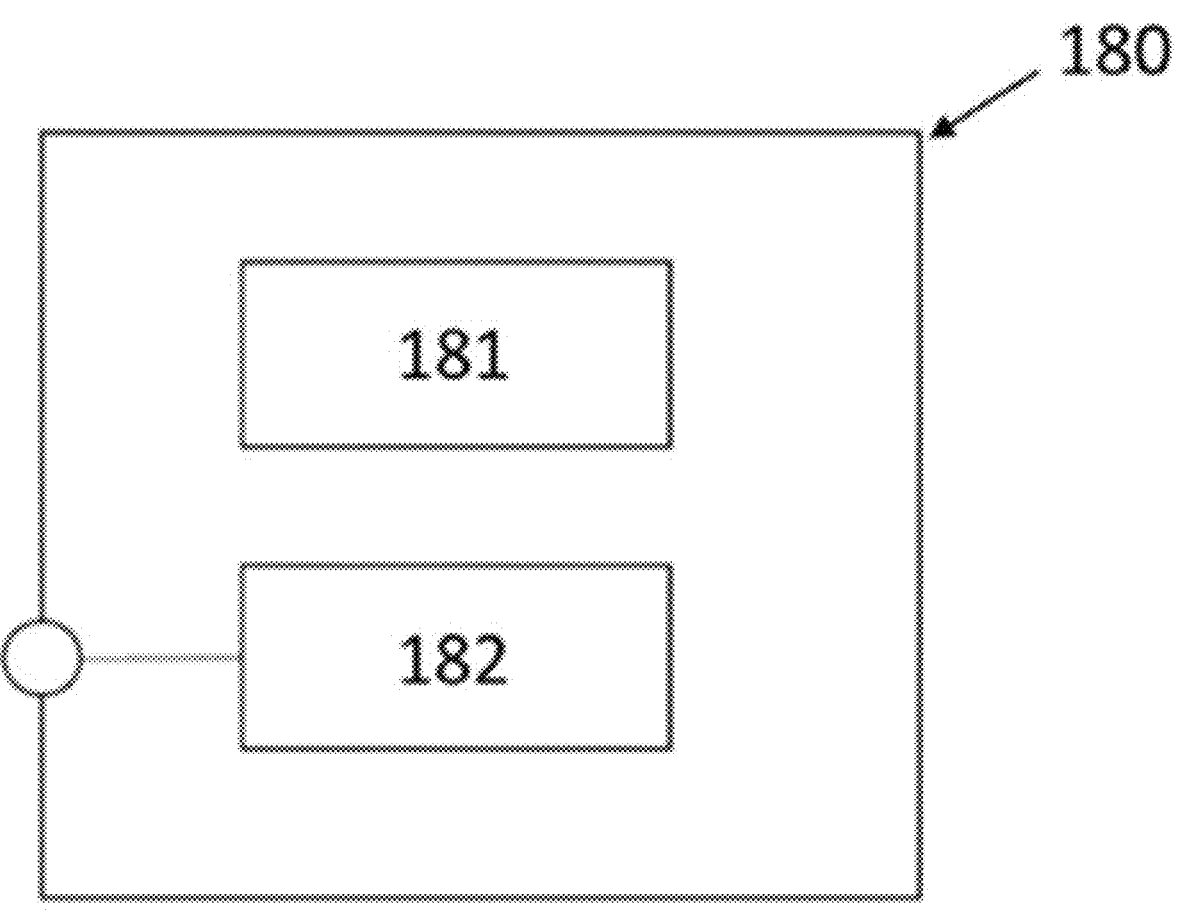
FIG. 13 is a schematic diagram illustrating a preferred embodiment of a system device.

As an example 2, a semiconductor element was produced in the same manner as example 1 except that a thickness of the metal oxide layer (electrically-conductive metal oxide film) 102a was made to be thicker than a thickness of the metal oxide layer of the semiconductor element made in the example 1. The thickness of the metal oxide layer (electrically-conductive metal oxide film) 102a was made to be equal to or more than 10 nm. A exterior photograph of the obtained semiconductor element of the example 2 is illustrated in FIG. 8. The observation result of the cross-sectional TEM at the analysis point of FIG. 8 is illustrated in FIG. 9. The result of TEM-EDS analysis is illustrated in FIG. 11. As apparent from FIGS. 9 and 11, it can be seen that the film of alpha-$(Ti_XGa_{1-X})_2O$ (in the $_3$ equation, $0.5<X<1$) is well formed. Further, the I-V measurement of the semiconductor element of the example 2 was conducted. The result of the I-V measurement is illustrated in FIG. 7. As illustrated in FIG. 7, since the metal oxide layer (electrically-conductive metal oxide film) 102*a* has a sufficient thickness, it can be seen that the semiconductor element of the example 1 has more enhanced semiconductor characteristics than the semiconductor element of the example 1.

Further, the semiconductor element is preferably a vertical device. The semiconductor device is especially useful for power devices. Examples of the semiconductor element includes, a diode (for example, a PN diode, a Schottky barrier diode, a junction barrier Schottky diode) and a transistor (for example, MOSFET or MESFET.). Among them, a diode is preferable, and Schottky barrier diode (SBD) is more preferable.

Figures 14, 15:
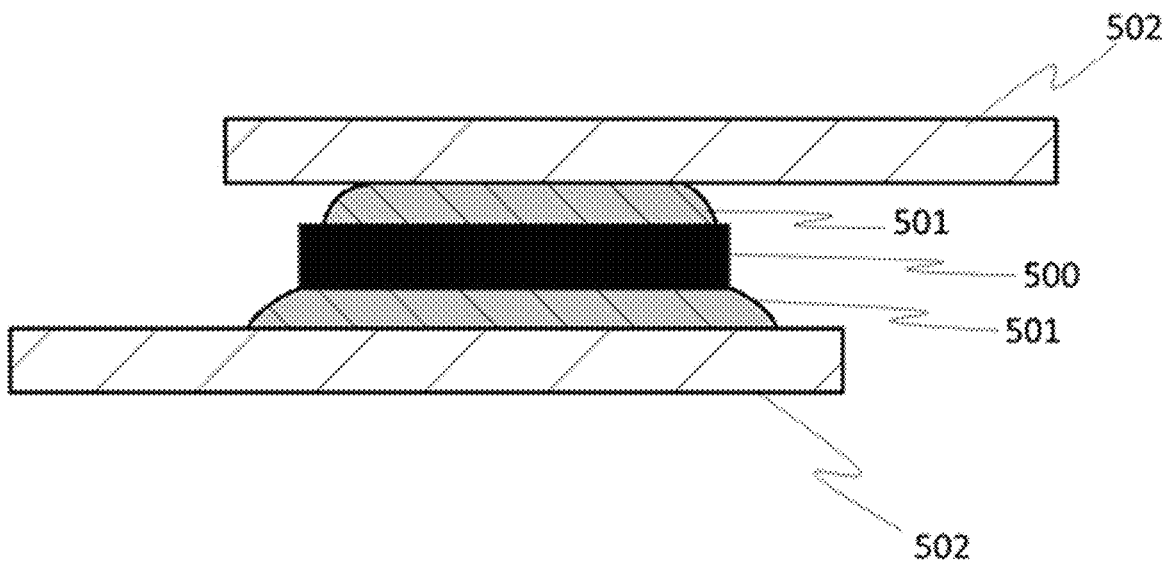
FIG. 14 is a schematic diagram illustrating a preferred embodiment of a power supply circuit diagram of the power supply.
FIG. 15 is a schematic diagram illustrating a preferred embodiment of a semiconductor device.

The semiconductor element according to an embodiment of the disclosure, in addition to the above description, may be used as a semiconductor device. The semiconductor device is obtained by bonding the semiconductor element to the lead frame, or a circuit board (a heat radiating substrate or the like. In particular, the semiconductor element is preferably used for a power module, inverter, or a converter. Also, the semiconductor element is preferably used for a semiconductor system using a power supply device. A semiconductor device according to a preferred embodiment of the disclosure is illustrated in FIG. 15. In the semiconductor device of FIG. 15, both sides of a semiconductor element 500, are bonded to lead frame or a board via solder 501. Here, the board is a circuit board or a heat dissipation board. With this configuration, it is possible to obtain a semiconductor device having enhanced heat dissipation. According to an embodiment of the disclosure, it is preferable that the periphery of the bonding member such as solder is sealed with resin.

Figure 16:
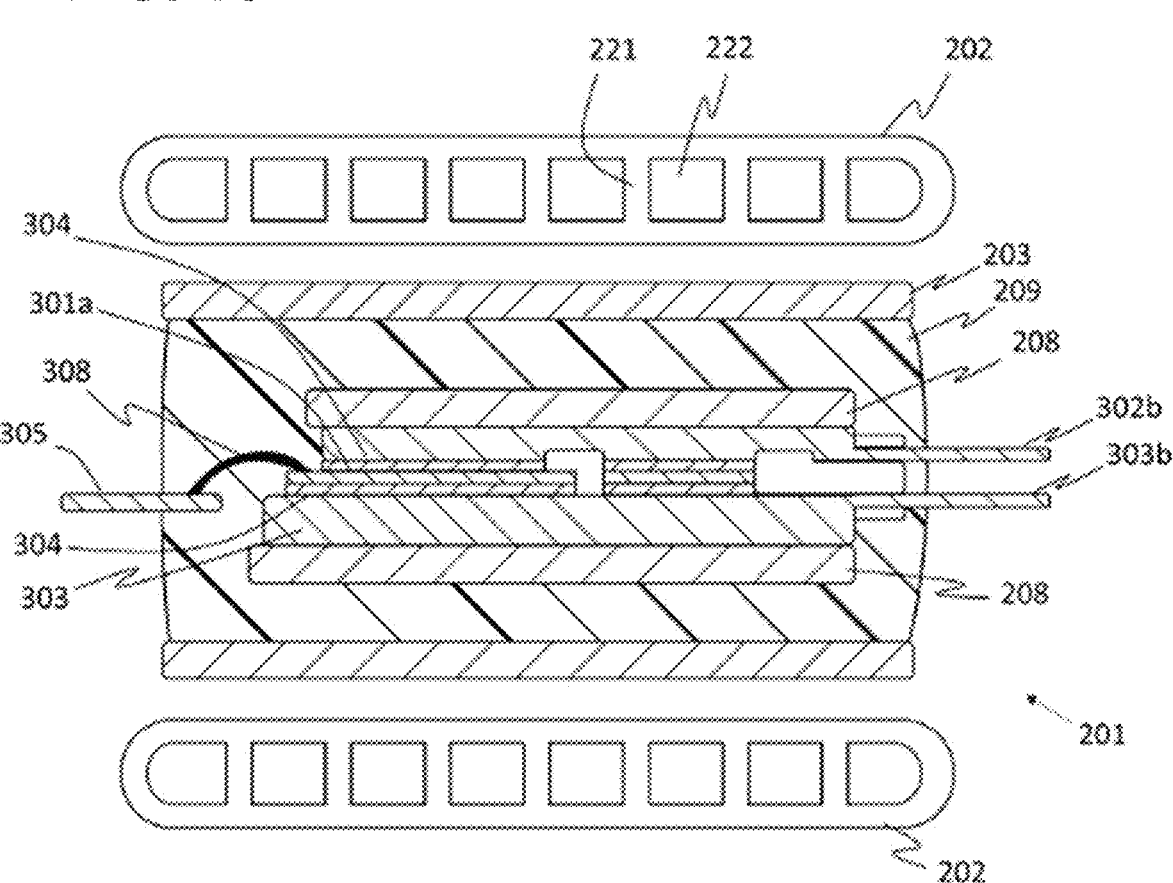
FIG. 16 is a schematic diagram illustrating a preferred embodiment of a power card.
Figure 17:
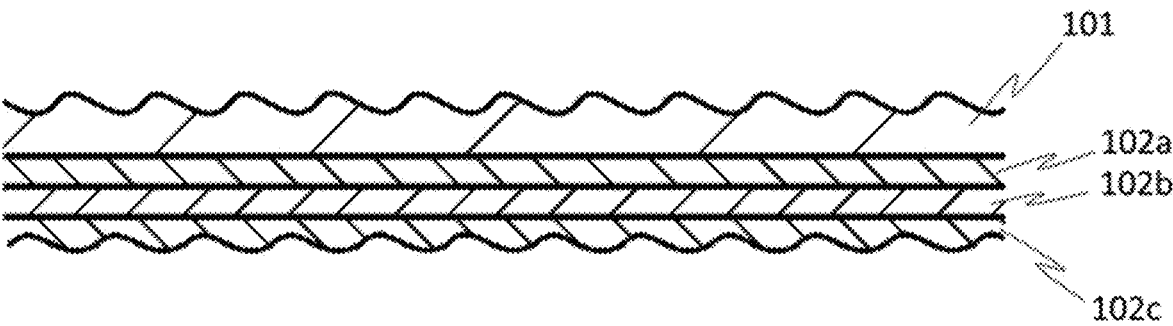
FIG. 17 is a schematic diagram illustrating a multilayer structure that is a major portion of the semiconductor element according to an embodiment of the disclosure.

The semiconductor device according to an embodiment of the disclosure may be used as a power module, an inverter, and/or a converter in combination with a known structure. Also, a semiconductor device according to an embodiment of the disclosure may be used in a semiconductor system including a power source. In the power source, the semiconductor device may be electrically connected, by a known structure and/or method, to a wiring pattern in the semiconductor system. FIG. 15 is a schematic diagram illustrating an embodiment of a power source system. The power source system 170 of FIG. 15 includes two or more power source devices 171 and 172, and a control circuit 173. As illustrated in FIG. 16, the power source system 182 may be used for a system device 180 in combination with an electric circuit 181. An example of a power source circuit of a power source device is illustrated in FIG. 17. The power source circuit of FIG. 17 includes a power circuit and a control circuit. A DC voltage is switched at high frequencies by an inverter (configured with MOSFET A to D) to be converted to AC, followed by insulation and transformation by a transformer. The voltage is then rectified by a rectification MOSFET and then smoothed by a DCL (smoothing coils L1 and L2) and a capacitor to output a direct current voltage. At this point, the output voltage is compared with a reference voltage by a voltage comparator 197 to control the inverter 192 and the rectification MOSFETs 194 by a PWM control circuit 196 to have a desired output voltage.

According to an embodiment of the disclosure, the semiconductor device is preferably a power card, and is more preferably the power card including a first cooling device provided on a first side of a semiconductor layer including the crystalline oxide semiconductor via a first insulating member and a second cooling device provided on a second side of the semiconductor layer via a second insulating member. Here, the second side of the semiconductor layer is opposite to the first side of the semiconductor layer. Further, it is most preferable that a first heat dissipation layer is provided on the first side of the semiconductor layer and a second heat dissipation layer is provided on the second side of the semiconductor layer. According to the most preferable embodiment the first cooling device is provided on the first heat dissipation layer via the first insulating member and the second cooling device is provided on the second heat dissipation layer via the second insulating member. FIG. 16 illustrates a power card according to an embodiment of the present disclosure. The power card of FIG. 16 is a double-sided cooled power card 201 including a refrigerant tube 202, a spacer 203, an insulating plate (an insulating spacer) 208, a resin sealing portion 209, a semiconductor chip 301*a*, a metal heat transfer plate (a protruding terminal portion) 302*b*, a heat sink and an electrode 303, a metal heat transfer plate (a protruding terminal portion) 303*b*, a solder layer 304, a control electrode terminal 305, and a bonding wire 308. A refrigerant tube 202 has a number of flow paths 222, in a thickness direction cross section thereof, that are partitioned by a number of partition walls 221 extending in a flow path direction at certain intervals from each other. The power card according to the embodiment of the present disclosure enables to realize a higher heat dissipation and satisfy a higher reliability.

A semiconductor chip 301*a* is bonded by a solder layer 304 on an inner main plane of the metal heat transfer plate 302*b*. The metal heat transfer plate (protruding terminal portion) 302*b* is bonded by a solder layer 304 on a remaining area of the main plane of the semiconductor chip 301*a*, so that a surface of an anode electrode and a surface of a cathode electrode of a flywheel diode are connected in so-called antiparallel, to a surface of a collector electrode and a surface of a emitter electrode of IGBT. Examples of material of the metal heat transfer plate (protruding terminal portions) 302*b* and 303*b* include Mo and W. The metal heat transfer plate (protruding terminal portions) 302*b* and 303*b* have a difference in thickness that absorbs a difference in thicknesses between the semiconductor chip 301*a* and 301*b*. This configuration enables an outer surface of the metal heat transfer plate 302 to be planar.

A resin sealing portion 209 is made of, for example, epoxy resin. Side surfaces of the metal heat transfer plate 302*b* and 303*b* are covered to be molded with the resin sealing portion 209, and the semiconductor chip 301*a* is molded with the resin sealing portion 209. However, outer main plane of the heat transfer plates 302*b* and 303*b*, that is, contact heat receiving surface of the heat transfer plates 302*b* and 303*b* is completely exposed. The metal heat transfer plate (protruding terminal portions) 302*b* and 303*b* protrudes to the right from the resin sealing portion 209, as illustrated in FIG. 16. The control electrode terminal 305 that is a lead frame terminal connects, for example, a gate (control) electrode surface of the semiconductor chip 301*a* on which IGBT is formed and the control electrode terminal 305.

The insulating plate 208 that is an insulating spacer, is made of, for example, an aluminum nitride film, but may be other insulating films. The insulating plate 208 is completely covering the metal heat transfer plates 302*b* and 303*b* and is in close contact with the metal heat transfer plates 302b and 303b, however, the insulating plate 208 and the metal heat transfer plates 302b and 303b may be simply in contact. A high heat transfer material such as a silicon grease may be applied between the insulating plate 208 and the metal heat transfer plates 302b and 303b. Also, the insulating plate 208 and the metal heat transfer plates 302b and 303b may be joined by using various methods. Further, an insulating layer may be formed as the insulating plate 208 by using ceramic spraying and the like. The insulating plate 208 may be bonded to the metal heat transfer plate or may be joined or formed on the refrigerant tube.

The electrically-conductive metal oxide film and the semiconductor element according to the disclosure may be used in various fields such as semiconductors (for example, compound semiconductor electronic devices), electronic components and electric equipment components, optical and electronic photography-related devices and industrial members, and especially useful for power devices.

The embodiments of the present invention are exemplified in all respects, and the scope of the present invention includes all modifications within the meaning and scope equivalent to the scope of claims.

REFERENCE SIGNS LIST

101 Semiconductor layer
101 first semiconductor layer
101b second semiconductor layer
102 Ohmic electrode
102 metal oxide layer (electrically-conductive metal oxide film)
102b metal layer
102c metal layer
103 Schottky electrode
103 metal layer
103b metal layer
103 metal layer
104 Insulating film
108 porous layer
109 substrate
110 crystal-growth substrate
170 power source system
171 power source device
172 power source device
173 control circuit
180 system device
181 electric circuit
182 power source system
192 inverter
193 transformer
194 MOSFET
195 DCL
196 PWM control circuit
197 voltage comparator
201 double-sided cooled power card
202 refrigerant tube
203 spacer
208 insulating plate (an insulating spacer)
209 resin sealing portion
221 partition wall
222 flow path
301a semiconductor chip
302b metal heat transfer plate (a protruding terminal portion)
303 heat sink and an electrode 303b metal heat transfer plate (a protruding terminal portion)
304 solder layer
305 control electrode terminal
308 bonding wire
500 Semiconductor element
501 solder
502 lead frame, circuit board or heat dissipation board

What is claimed is:

1. A multilayer structure comprising:
a semiconductor layer; and
a conductive metal oxide film and a metal layer that are positioned over the semiconductor layer, wherein
the conductive metal oxide film comprises a metal oxide as a major component,
the metal oxide includes at least a first metal selected from a metal of Group 4 of the periodic table and a second metal selected from a metal of Group 13 of the periodic table,
the metal layer comprises at least the first metal,
the semiconductor layer comprises at least the second metal and a dopant,
the conductive metal oxide film is in direct contact with the semiconductor layer,
where an amount of the first metal relative to a total amount of the first metal and the second metal is x in terms of a composition ratio in the metal oxide, x satisfies 0.5<x<1.0, and
the composition ratio of the first metal relative to the total amount of the first metal and the second metal contained in the metal oxide is greater than a composition ratio of the dopant to the semiconductor layer.

2. The multilayer structure according to claim 1, wherein the first metal is titanium.

3. The multilayer structure according to claim 1, wherein the second metal is gallium.

4. The multilayer structure according to claim 1, wherein the metal oxide is a crystalline metal oxide.

5. The multilayer structure according to claim 4, wherein the metal oxide has a corundum structure.

6. The multilayer structure according to claim 1, wherein the conductive metal oxide film is between the semiconductor layer and the metal layer.

7. The multilayer structure according to claim 1, wherein the conductive metal oxide film is in ohmic contact with the semiconductor layer.

8. A semiconductor element, comprising:
a semiconductor layer; and
a conductive metal oxide film and a metal layer that are positioned over the semiconductor layer, wherein
the conductive metal oxide film comprises a metal oxide as a major component,
the metal oxide includes at least a first metal selected from a metal of Group 4 of the periodic table and a second metal selected from a metal of Group 13 of the periodic table,
the metal layer comprises at least the first metal,
the semiconductor layer comprises at least the second metal and a dopant,
the conductive metal oxide film is in direct contact with the semiconductor layer,
where an amount of the first metal relative to a total amount of the first metal and the second metal is x in terms of a composition ratio in the metal oxide, x satisfies 0.5<x<1.0, and
the composition ratio of the first metal relative to the total amount of the first metal and the second metal contained in the metal oxide is greater than a composition ratio of the dopant to the semiconductor layer.

9. The semiconductor element according to claim 8, wherein the semiconductor element is a vertical device.

10. The semiconductor element according to claim 8, wherein the semiconductor element is a power device.

11. A semiconductor device, comprising:
the semiconductor element according to claim 8;
a board; and
a jointing material,
wherein the semiconductor element is bonded with the board by the jointing material, and
wherein the board is a circuit board or a heat dissipation board.

12. The semiconductor device according to claim 11, wherein the semiconductor device is a power module, an inverter, or a converter.

13. The semiconductor device according to claim 11, wherein the semiconductor device is a power card.

14. A semiconductor system, comprising:
the semiconductor element according to claim 8.

* * * * *